United States Patent
Shalvi et al.

(10) Patent No.: US 8,060,806 B2
(45) Date of Patent: Nov. 15, 2011

(54) ESTIMATION OF NON-LINEAR DISTORTION IN MEMORY DEVICES

(75) Inventors: Ofir Shalvi, Ra'anana (IL); Naftali Sommer, Rishon Le-Zion (IL); Eyal Gurgi, Petah-Tikva (IL); Oren Golov, Hod Hasharon (IL); Dotan Sokolov, Ra'anana (IL)

(73) Assignee: Anobit Technologies Ltd., Herzliya Pituach (IL)

( * ) Notice: Subject to any disclaimer, the term of this patent is extended or adjusted under 35 U.S.C. 154(b) by 415 days.

(21) Appl. No.: 11/995,813

(22) PCT Filed: Aug. 27, 2007

(86) PCT No.: PCT/IL2007/001059
§ 371 (c)(1),
(2), (4) Date: Jan. 15, 2008

(87) PCT Pub. No.: WO2008/026203
PCT Pub. Date: Mar. 6, 2008

(65) Prior Publication Data
US 2010/0131826 A1     May 27, 2010

Related U.S. Application Data

(60) Provisional application No. 60/867,399, filed on Nov. 28, 2006, provisional application No. 60/823,650, filed on Aug. 27, 2006, provisional application No. 60/939,077, filed on May 20, 2007.

(51) Int. Cl.
*G11C 29/00* (2006.01)

(52) U.S. Cl. ........................................... 714/763

(58) Field of Classification Search ................ None
See application file for complete search history.

(56) References Cited

U.S. PATENT DOCUMENTS

| | | | |
|---|---|---|---|
| 4,556,961 A | 12/1985 | Iwahashi et al. |
| 4,558,431 A | 12/1985 | Satoh |
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |

(Continued)

FOREIGN PATENT DOCUMENTS
EP          0783754 B1    7/1997

(Continued)

OTHER PUBLICATIONS

Bez et al., "Introduction to Flash Memory," Proceedings of the IEEE, vol. 91, No. 4, Apr. 2003, pp. 489-502.

(Continued)

*Primary Examiner* — John Trimmings
(74) *Attorney, Agent, or Firm* — D. Kligler I.P. Services Ltd.

(57) ABSTRACT

A method for operating a memory (24) includes storing data in analog memory cells (32) of the memory by writing respective analog values to the analog memory cells. A set of the analog memory cells is identified, including an interfered cell having a distortion that is statistically correlated with the respective analog values of the analog memory cells in the set. A mapping is determined between combinations of possible analog values of the analog memory cells in the set and statistical characteristics of composite distortion levels present in the interfered memory cell. The mapping is applied so as to compensate for the distortion in the interfered memory cell.

51 Claims, 5 Drawing Sheets

U.S. PATENT DOCUMENTS

| | | | |
|---|---|---|---|
| 4,910,706 A | 3/1990 | Hyatt | |
| 4,993,029 A | 2/1991 | Galbraith et al. | |
| 5,056,089 A | 10/1991 | Furuta et al. | |
| 5,077,722 A | 12/1991 | Geist et al. | |
| 5,126,808 A | 6/1992 | Montalvo et al. | |
| 5,163,021 A | 11/1992 | Mehrotra et al. | |
| 5,172,338 A | 12/1992 | Mehrotta et al. | |
| 5,191,584 A | 3/1993 | Anderson | |
| 5,200,959 A | 4/1993 | Gross et al. | |
| 5,237,535 A | 8/1993 | Mielke et al. | |
| 5,272,669 A | 12/1993 | Samachisa et al. | |
| 5,276,649 A | 1/1994 | Hoshita et al. | |
| 5,287,469 A | 2/1994 | Tsuboi | |
| 5,365,484 A | 11/1994 | Cleveland et al. | |
| 5,388,064 A | 2/1995 | Khan | |
| 5,416,646 A | 5/1995 | Shirai | |
| 5,416,782 A | 5/1995 | Wells et al. | |
| 5,473,753 A | 12/1995 | Wells et al. | |
| 5,479,170 A | 12/1995 | Cauwenberghs et al. | |
| 5,508,958 A | 4/1996 | Fazio et al. | |
| 5,519,831 A | 5/1996 | Holzhammer | |
| 5,532,962 A | 7/1996 | Auclair et al. | |
| 5,541,886 A | 7/1996 | Hasbun | |
| 5,600,677 A | 2/1997 | Citta et al. | |
| 5,638,320 A | 6/1997 | Wong et al. | |
| 5,657,332 A | 8/1997 | Auclair et al. | |
| 5,675,540 A | 10/1997 | Roohparvar | |
| 5,682,352 A | 10/1997 | Wong et al. | |
| 5,687,114 A | 11/1997 | Khan | |
| 5,696,717 A | 12/1997 | Koh | |
| 5,726,649 A | 3/1998 | Tamaru et al. | |
| 5,726,934 A | 3/1998 | Tran et al. | |
| 5,742,752 A | 4/1998 | De Koning | |
| 5,748,533 A | 5/1998 | Dunlap et al. | |
| 5,748,534 A | 5/1998 | Dunlap et al. | |
| 5,751,637 A | 5/1998 | Chen et al. | |
| 5,761,402 A | 6/1998 | Kaneda et al. | |
| 5,798,966 A * | 8/1998 | Keeney | 365/185.18 |
| 5,801,985 A | 9/1998 | Roohparvar et al. | |
| 5,838,832 A | 11/1998 | Barnsley | |
| 5,860,106 A | 1/1999 | Domen et al. | |
| 5,867,114 A | 2/1999 | Barbir | |
| 5,867,429 A * | 2/1999 | Chen et al. | 365/185.33 |
| 5,877,986 A | 3/1999 | Harari et al. | |
| 5,889,937 A | 3/1999 | Tamagawa | |
| 5,901,089 A | 5/1999 | Korsh et al. | |
| 5,909,449 A | 6/1999 | So et al. | |
| 5,912,906 A | 6/1999 | Wu et al. | |
| 5,930,167 A | 7/1999 | Lee et al. | |
| 5,937,424 A | 8/1999 | Leak et al. | |
| 5,942,004 A | 8/1999 | Cappelletti | |
| 5,969,986 A | 10/1999 | Wong et al. | |
| 5,991,517 A | 11/1999 | Harari et al. | |
| 5,995,417 A | 11/1999 | Chen et al. | |
| 6,009,014 A | 12/1999 | Hollmer et al. | |
| 6,034,891 A | 3/2000 | Norman | |
| 6,040,993 A | 3/2000 | Chen et al. | |
| 6,041,430 A | 3/2000 | Yamauchi | |
| 6,073,204 A | 6/2000 | Lakhani et al. | |
| 6,101,614 A | 8/2000 | Gonzales et al. | |
| 6,128,237 A | 10/2000 | Shirley et al. | |
| 6,134,140 A | 10/2000 | Tanaka et al. | |
| 6,134,143 A | 10/2000 | Norman | |
| 6,134,631 A | 10/2000 | Jennings | |
| 6,141,261 A | 10/2000 | Patti | |
| 6,166,962 A | 12/2000 | Chen et al. | |
| 6,178,466 B1 | 1/2001 | Gilbertson et al. | |
| 6,185,134 B1 | 2/2001 | Tanaka et al. | |
| 6,209,113 B1 | 3/2001 | Roohparvar | |
| 6,212,654 B1 | 4/2001 | Lou et al. | |
| 6,219,276 B1 | 4/2001 | Parker | |
| 6,219,447 B1 | 4/2001 | Lee et al. | |
| 6,222,762 B1 | 4/2001 | Guterman et al. | |
| 6,230,233 B1 | 5/2001 | Lofgren et al. | |
| 6,240,458 B1 | 5/2001 | Gilbertson | |
| 6,275,419 B1 | 8/2001 | Guterman et al. | |
| 6,279,069 B1 | 8/2001 | Robinson et al. | |
| 6,288,944 B1 | 9/2001 | Kawamura | |
| 6,292,394 B1 | 9/2001 | Cohen et al. | |
| 6,301,151 B1 | 10/2001 | Engh et al. | |
| 6,304,486 B1 | 10/2001 | Yano | |
| 6,307,776 B1 | 10/2001 | So et al. | |
| 6,317,363 B1 | 11/2001 | Guterman et al. | |
| 6,317,364 B1 | 11/2001 | Guterman et al. | |
| 6,345,004 B1 | 2/2002 | Omura et al. | |
| 6,360,346 B1 | 3/2002 | Miyauchi et al. | |
| 6,363,008 B1 | 3/2002 | Wong | |
| 6,363,454 B1 | 3/2002 | Lakhani et al. | |
| 6,366,496 B1 | 4/2002 | Torelli et al. | |
| 6,396,742 B1 | 5/2002 | Korsh et al. | |
| 6,397,364 B1 | 5/2002 | Barkan | |
| 6,405,323 B1 | 6/2002 | Lin et al. | |
| 6,418,060 B1 | 7/2002 | Yong et al. | |
| 6,442,585 B1 | 8/2002 | Dean et al. | |
| 6,456,528 B1 | 9/2002 | Chen | |
| 6,466,476 B1 | 10/2002 | Wong et al. | |
| 6,467,062 B1 | 10/2002 | Barkan | |
| 6,469,931 B1 | 10/2002 | Ban et al. | |
| 6,522,580 B2 | 2/2003 | Chen et al. | |
| 6,525,952 B2 | 2/2003 | Araki et al. | |
| 6,532,556 B1 | 3/2003 | Wong et al. | |
| 6,538,922 B1 | 3/2003 | Khalid et al. | |
| 6,558,967 B1 | 5/2003 | Wong | |
| 6,560,152 B1 | 5/2003 | Cernea | |
| 6,577,539 B2 | 6/2003 | Iwahashi | |
| 6,584,012 B2 | 6/2003 | Banks | |
| 6,615,307 B1 | 9/2003 | Roohparvar | |
| 6,621,739 B2 | 9/2003 | Gonzalez et al. | |
| 6,643,169 B2 | 11/2003 | Rudelic et al. | |
| 6,646,913 B2 | 11/2003 | Micheloni et al. | |
| 6,678,192 B2 | 1/2004 | Gongwer et al. | |
| 6,687,155 B2 | 2/2004 | Nagasue | |
| 6,707,748 B2 | 3/2004 | Lin et al. | |
| 6,708,257 B2 | 3/2004 | Bao | |
| 6,714,449 B2 | 3/2004 | Khalid | |
| 6,717,847 B2 | 4/2004 | Chen | |
| 6,731,557 B2 | 5/2004 | Beretta | |
| 6,738,293 B1 | 5/2004 | Iwahashi | |
| 6,751,766 B2 | 6/2004 | Guterman et al. | |
| 6,757,193 B2 | 6/2004 | Chen et al. | |
| 6,774,808 B1 | 8/2004 | Hibbs et al. | |
| 6,781,877 B2 | 8/2004 | Cernea et al. | |
| 6,807,095 B2 | 10/2004 | Chen et al. | |
| 6,809,964 B2 | 10/2004 | Moschopoulos et al. | |
| 6,829,167 B2 | 12/2004 | Tu et al. | |
| 6,845,052 B1 | 1/2005 | Ho et al. | |
| 6,851,018 B2 | 2/2005 | Wyatt et al. | |
| 6,856,546 B2 | 2/2005 | Guterman et al. | |
| 6,862,218 B2 | 3/2005 | Guterman et al. | |
| 6,870,767 B2 | 3/2005 | Rudelic et al. | |
| 6,894,926 B2 | 5/2005 | Guterman et al. | |
| 6,907,497 B2 | 6/2005 | Hosono et al. | |
| 6,930,925 B2 | 8/2005 | Guo et al. | |
| 6,934,188 B2 | 8/2005 | Roohparvar | |
| 6,937,511 B2 | 8/2005 | Hsu et al. | |
| 6,963,505 B2 | 11/2005 | Cohen | |
| 6,972,993 B2 | 12/2005 | Conley et al. | |
| 6,988,175 B2 | 1/2006 | Lasser | |
| 6,992,932 B2 | 1/2006 | Cohen | |
| 7,002,843 B2 | 2/2006 | Guterman et al. | |
| 7,012,835 B2 | 3/2006 | Gonzalez et al. | |
| 7,020,017 B2 | 3/2006 | Chen et al. | |
| 7,023,735 B2 | 4/2006 | Ban et al. | |
| 7,031,210 B2 | 4/2006 | Park et al. | |
| 7,031,214 B2 | 4/2006 | Tran | |
| 7,031,216 B2 | 4/2006 | You | |
| 7,039,846 B2 | 5/2006 | Hewitt et al. | |
| 7,042,766 B1 | 5/2006 | Wang et al. | |
| 7,054,193 B1 | 5/2006 | Wong | |
| 7,054,199 B2 | 5/2006 | Lee et al. | |
| 7,057,958 B2 | 6/2006 | So et al. | |
| 7,065,147 B2 | 6/2006 | Ophir et al. | |
| 7,068,539 B2 | 6/2006 | Guterman et al. | |
| 7,071,849 B2 | 7/2006 | Zhang | |
| 7,079,555 B2 | 7/2006 | Baydar et al. | |
| 7,088,615 B2 | 8/2006 | Guterman et al. | |
| 7,099,194 B2 | 8/2006 | Tu et al. | |

| | | | | | | |
|---|---|---|---|---|---|---|
| 7,102,924 B2 | 9/2006 | Chen et al. | | 7,761,624 B2 | 7/2010 | Karamcheti et al. |
| 7,113,432 B2 | 9/2006 | Mokhlesi | | 7,810,017 B2 | 10/2010 | Radke |
| 7,130,210 B2 | 10/2006 | Bathul et al. | | 7,848,149 B2 | 12/2010 | Gonzalez et al. |
| 7,139,192 B1 | 11/2006 | Wong | | 7,885,119 B2 | 2/2011 | Li |
| 7,139,198 B2 | 11/2006 | Guterman et al. | | 2001/0002172 A1 | 5/2001 | Tanaka et al. |
| 7,151,692 B2 | 12/2006 | Wu | | 2001/0006479 A1 | 7/2001 | Ikehashi et al. |
| 7,170,802 B2 | 1/2007 | Cernea et al. | | 2002/0038440 A1 | 3/2002 | Barkan |
| 7,173,859 B2 | 2/2007 | Hemink | | 2002/0118574 A1 | 8/2002 | Gongwer et al. |
| 7,177,184 B2 | 2/2007 | Chen | | 2002/0133684 A1 | 9/2002 | Anderson |
| 7,177,195 B2 | 2/2007 | Gonzalez et al. | | 2002/0174295 A1 | 11/2002 | Ulrich et al. |
| 7,177,199 B2 | 2/2007 | Chen et al. | | 2002/0196510 A1 | 12/2002 | Hietala et al. |
| 7,177,200 B2 | 2/2007 | Ronen et al. | | 2003/0002348 A1 | 1/2003 | Chen et al. |
| 7,184,338 B2 | 2/2007 | Nagakawa et al. | | 2003/0103400 A1 | 6/2003 | Van Tran |
| 7,187,195 B2 | 3/2007 | Kim | | 2003/0161183 A1 | 8/2003 | Tran |
| 7,187,592 B2 | 3/2007 | Guterman et al. | | 2003/0189856 A1 | 10/2003 | Cho et al. |
| 7,190,614 B2 | 3/2007 | Wu | | 2004/0057265 A1 | 3/2004 | Mirabel et al. |
| 7,193,898 B2 * | 3/2007 | Cernea ............... 365/185.22 | | 2004/0057285 A1 | 3/2004 | Cernea et al. |
| 7,193,921 B2 | 3/2007 | Choi et al. | | 2004/0083333 A1 | 4/2004 | Chang et al. |
| 7,196,928 B2 | 3/2007 | Chen | | 2004/0083334 A1 | 4/2004 | Chang et al. |
| 7,197,594 B2 | 3/2007 | Raz et al. | | 2004/0105311 A1 | 6/2004 | Cernea et al. |
| 7,200,062 B2 | 4/2007 | Kinsely et al. | | 2004/0114437 A1 | 6/2004 | Li |
| 7,221,592 B2 | 5/2007 | Nazarian | | 2004/0160842 A1 | 8/2004 | Fukiage |
| 7,224,613 B2 | 5/2007 | Chen et al. | | 2004/0223371 A1 * | 11/2004 | Roohparvar ............. 365/185.22 |
| 7,231,474 B1 | 6/2007 | Helms et al. | | 2005/0007802 A1 | 1/2005 | Gerpheide |
| 7,231,562 B2 | 6/2007 | Ohlhoff et al. | | 2005/0013165 A1 | 1/2005 | Ban |
| 7,243,275 B2 | 7/2007 | Gongwer et al. | | 2005/0024941 A1 | 2/2005 | Lasser et al. |
| 7,254,690 B2 | 8/2007 | Rao | | 2005/0024978 A1 | 2/2005 | Ronen |
| 7,257,027 B2 | 8/2007 | Park | | 2005/0086574 A1 | 4/2005 | Fackenthal |
| 7,259,987 B2 | 8/2007 | Chen et al. | | 2005/0121436 A1 | 6/2005 | Kamitani et al. |
| 7,266,026 B2 | 9/2007 | Gongwer et al. | | 2005/0157555 A1 | 7/2005 | Ono et al. |
| 7,274,611 B2 | 9/2007 | Roohparvar | | 2005/0162913 A1 | 7/2005 | Chen |
| 7,277,355 B2 | 10/2007 | Tanzana | | 2005/0169051 A1 | 8/2005 | Khalid et al. |
| 7,280,398 B1 | 10/2007 | Lee et al. | | 2005/0189649 A1 | 9/2005 | Maruyama et al. |
| 7,280,409 B2 | 10/2007 | Misumi et al. | | 2005/0213393 A1 | 9/2005 | Lasser |
| 7,289,344 B2 | 10/2007 | Chen | | 2005/0224853 A1 | 10/2005 | Ohkawa |
| 7,301,807 B2 | 11/2007 | Khalid et al. | | 2005/0240745 A1 | 10/2005 | Iyer et al. |
| 7,301,817 B2 | 11/2007 | Li et al. | | 2005/0243626 A1 | 11/2005 | Ronen |
| 7,308,525 B2 | 12/2007 | Lasser et al. | | 2006/0004952 A1 | 1/2006 | Lasser |
| 7,310,255 B2 | 12/2007 | Chan | | 2006/0028875 A1 | 2/2006 | Avraham et al. |
| 7,310,272 B1 | 12/2007 | Mokhlesi et al. | | 2006/0028877 A1 | 2/2006 | Meir |
| 7,310,347 B2 | 12/2007 | Lasser | | 2006/0101193 A1 | 5/2006 | Murin |
| 7,321,509 B2 | 1/2008 | Chen et al. | | 2006/0107136 A1 | 5/2006 | Gongwer et al. |
| 7,342,831 B2 | 3/2008 | Mokhlesi et al. | | 2006/0129750 A1 | 6/2006 | Lee et al. |
| 7,345,928 B2 | 3/2008 | Li | | 2006/0133141 A1 | 6/2006 | Gorobets |
| 7,349,263 B2 | 3/2008 | Kim et al. | | 2006/0156189 A1 | 7/2006 | Tomlin |
| 7,356,755 B2 | 4/2008 | Fackenthal | | 2006/0179334 A1 | 8/2006 | Brittain et al. |
| 7,363,420 B2 | 4/2008 | Lin et al. | | 2006/0190699 A1 | 8/2006 | Lee |
| 7,388,781 B2 | 6/2008 | Litsyn et al. | | 2006/0203546 A1 | 9/2006 | Lasser |
| 7,397,697 B2 | 7/2008 | So et al. | | 2006/0218359 A1 | 9/2006 | Sanders et al. |
| 7,408,804 B2 | 8/2008 | Hemink et al. | | 2006/0221692 A1 * | 10/2006 | Chen .................. 365/185.11 |
| 7,408,810 B2 * | 8/2008 | Aritome et al. ......... 365/185.23 | | 2006/0221705 A1 | 10/2006 | Hemink et al. |
| 7,409,473 B2 | 8/2008 | Conley et al. | | 2006/0221714 A1 | 10/2006 | Li et al. |
| 7,420,847 B2 | 9/2008 | Li | | 2006/0239077 A1 | 10/2006 | Park et al. |
| 7,433,231 B2 | 10/2008 | Aritome | | 2006/0239081 A1 * | 10/2006 | Roohparvar ............. 365/185.22 |
| 7,437,498 B2 | 10/2008 | Ronen | | 2006/0256620 A1 | 11/2006 | Nguyen et al. |
| 7,440,324 B2 | 10/2008 | Mokhlesi | | 2006/0256626 A1 | 11/2006 | Werner et al. |
| 7,441,067 B2 | 10/2008 | Gorobetz et al. | | 2006/0256891 A1 | 11/2006 | Yuan et al. |
| 7,453,737 B2 | 11/2008 | Ha | | 2006/0271748 A1 | 11/2006 | Jain et al. |
| 7,460,410 B2 | 12/2008 | Nagai et al. | | 2006/0285392 A1 | 12/2006 | Incarnati et al. |
| 7,460,412 B2 | 12/2008 | Lee et al. | | 2006/0285396 A1 | 12/2006 | Ha |
| 7,466,592 B2 | 12/2008 | Mitani et al. | | 2007/0006013 A1 | 1/2007 | Moshayedi et al. |
| 7,468,907 B2 | 12/2008 | Kang et al. | | 2007/0019481 A1 | 1/2007 | Park |
| 7,468,911 B2 | 12/2008 | Lutze et al. | | 2007/0033581 A1 | 2/2007 | Tomlin et al. |
| 7,471,581 B2 | 12/2008 | Tran et al. | | 2007/0047314 A1 | 3/2007 | Goda et al. |
| 7,492,641 B2 | 2/2009 | Hosono et al. | | 2007/0047326 A1 | 3/2007 | Nguyen et al. |
| 7,508,710 B2 | 3/2009 | Mokhlesi | | 2007/0050536 A1 | 3/2007 | Kolokowsky |
| 7,539,062 B2 | 5/2009 | Doyle | | 2007/0058446 A1 | 3/2007 | Hwang et al. |
| 7,551,492 B2 | 6/2009 | Kim | | 2007/0061502 A1 | 3/2007 | Lasser et al. |
| 7,568,135 B2 * | 7/2009 | Cornwell et al. ............. 714/721 | | 2007/0067667 A1 | 3/2007 | Ikeuchi et al. |
| 7,570,520 B2 | 8/2009 | Kamei et al. | | 2007/0074093 A1 | 3/2007 | Lasser |
| 7,593,259 B2 | 9/2009 | Kim et al. | | 2007/0086239 A1 | 4/2007 | Litsyn et al. |
| 7,596,707 B1 | 9/2009 | Vemula | | 2007/0086260 A1 | 4/2007 | Sinclair |
| 7,631,245 B2 | 12/2009 | Lasser | | 2007/0089034 A1 | 4/2007 | Litsyn et al. |
| 7,633,798 B2 | 12/2009 | Sarin et al. | | 2007/0091677 A1 | 4/2007 | Lasser et al. |
| 7,633,802 B2 | 12/2009 | Mokhlesi | | 2007/0091694 A1 | 4/2007 | Lee et al. |
| 7,656,734 B2 | 2/2010 | Thorp et al. | | 2007/0103978 A1 | 5/2007 | Conley et al. |
| 7,660,158 B2 | 2/2010 | Aritome | | 2007/0103986 A1 | 5/2007 | Chen |
| 7,660,183 B2 | 2/2010 | Ware et al. | | 2007/0109845 A1 * | 5/2007 | Chen ....................... 365/185.2 |
| 7,742,351 B2 | 6/2010 | Inoue et al. | | 2007/0109849 A1 | 5/2007 | Chen |

| | | |
|---|---|---|
| 2007/0115726 A1 | 5/2007 | Cohen et al. |
| 2007/0118713 A1 | 5/2007 | Guterman et al. |
| 2007/0143378 A1 | 6/2007 | Gorobetz |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0263455 A1 | 11/2007 | Cornwell et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2007/0297234 A1* | 12/2007 | Cernea et al. .............. 365/185.18 |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0089123 A1 | 4/2008 | Chae et al. |
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1* | 10/2008 | Aritome .................. 365/185.17 |
| 2008/0263262 A1 | 10/2008 | Sokolov et al. |
| 2008/0270730 A1 | 10/2008 | Lasser et al. |
| 2008/0282106 A1 | 11/2008 | Shalvi et al. |
| 2009/0013233 A1 | 1/2009 | Radke |
| 2009/0024905 A1 | 1/2009 | Shalvi et al. |
| 2009/0034337 A1 | 2/2009 | Aritome |
| 2009/0043831 A1 | 2/2009 | Antonopoulos et al. |
| 2009/0043951 A1 | 2/2009 | Shalvi et al. |
| 2009/0049234 A1 | 2/2009 | Oh et al. |
| 2009/0073762 A1 | 3/2009 | Lee et al. |
| 2009/0086542 A1 | 4/2009 | Lee et al. |
| 2009/0089484 A1 | 4/2009 | Chu |
| 2009/0091979 A1 | 4/2009 | Shalvi |
| 2009/0094930 A1 | 4/2009 | Schwoerer |
| 2009/0106485 A1 | 4/2009 | Anholt |
| 2009/0112949 A1 | 4/2009 | Ergan et al. |
| 2009/0132755 A1 | 5/2009 | Radke |
| 2009/0144600 A1 | 6/2009 | Perlmutter et al. |
| 2009/0150894 A1 | 6/2009 | Huang et al. |
| 2009/0157950 A1 | 6/2009 | Selinger |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0172257 A1 | 7/2009 | Prins et al. |
| 2009/0172261 A1 | 7/2009 | Prins et al. |
| 2009/0204824 A1 | 8/2009 | Lin et al. |
| 2009/0204872 A1 | 8/2009 | Yu et al. |
| 2009/0225595 A1 | 9/2009 | Kim |
| 2009/0265509 A1 | 10/2009 | Klein |
| 2009/0300227 A1 | 12/2009 | Nochimowski et al. |
| 2009/0323412 A1 | 12/2009 | Mokhlesi et al. |
| 2009/0327608 A1 | 12/2009 | Eschmann |
| 2010/0017650 A1 | 1/2010 | Chin et al. |
| 2010/0034022 A1 | 2/2010 | Dutta et al. |
| 2010/0057976 A1 | 3/2010 | Lasser |
| 2010/0061151 A1 | 3/2010 | Miwa et al. |
| 2010/0110580 A1 | 5/2010 | Takashima |
| 2010/0131697 A1 | 5/2010 | Alrod et al. |
| 2010/0142268 A1* | 6/2010 | Aritome .................. 365/185.02 |
| 2010/0142277 A1 | 6/2010 | Yang et al. |
| 2010/0169743 A1 | 7/2010 | Vogan et al. |

FOREIGN PATENT DOCUMENTS

| | | |
|---|---|---|
| EP | 1434236 B1 | 6/2004 |
| EP | 1605509 A1 | 12/2005 |
| WO | 9610256 A1 | 4/1996 |
| WO | 9828745 A1 | 7/1998 |
| WO | 02100112 A1 | 12/2002 |
| WO | 2003100791 A1 | 12/2003 |
| WO | 2007046084 A2 | 4/2007 |
| WO | 2007132452 A2 | 11/2007 |
| WO | 2007132453 | 11/2007 |
| WO | 2007132456 A2 | 11/2007 |
| WO | 2007132457 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |

OTHER PUBLICATIONS

Eitan et al., "Multilevel Flash Cells and their Trade-Offs," Proceedings of the 1996 IEEE International Electron Devices Meeting (IEDM)5 New York, New York, pp. 169-172.

Eitan et al., "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pp. 522-524.

Maayan et al., "A 512Mb NROM Flash Data Storage Memory with 8MB/s Data Rate," Proceedings of the 2002 IEEE International Solid-State Circuits Conference (ISSCC 2002), San Fransisco, California, Feb. 3-7, 2002, pp. 100-101.

Kim and Koh, "Future Memory Technology including Emerging New Memories," Procedings of the 24 International Conference on Microelectronics (MIEL 2004), Nis, Serbia, and Montenegro, May 16-19, 2004, vol. 1, pp. 377-384.

Lee et al., "Effects of Floating-Gate Interference on NAND Flash Memory Cell Operation," IEEE Electron Device Letters, vol. 23, No. 5, May 2002, pp. 264-266.
U.S. Appl. No. 60/867,399 (Nov. 28, 2006).
U.S. Appl. No. 60/823,650 (Aug. 27, 2006).
U.S. Appl. No. 60/939,077 (May 20, 2007).
Hong et al., "NAND Flash-based Disk Cache Using SLC/MLC Combined Flash Memory", 2010 International Workshop on Storage Network Architecture and Parallel I/Os, pp. 21-30, USA, May 3, 2010.
U.S. Appl. No. 11/945,575 Official Action dated Aug. 24, 2010.
U.S. Appl. No. 12/045,520 Official Action dated Nov. 16, 2010.
U.S. Appl. No. 11/949,135 Official Action dated Oct. 2, 2009.
U.S. Appl. No. 12/019,011 Official Action dated Nov. 20, 2009.
Takeuchi et al., "A Multipage Cell Architecture for High-Speed Programming Multilevel NAND Flash Memories", IEEE Journal of Solid State Circuits, vol. 33, No. 8, Aug. 1998.
Jedec Standard JESD84-C44, "Embedded MultiMediaCard (e•MMC) Mechanical Standard, with Optional Reset Signal", Jedec Solid State Technology Association, USA, Jul. 2009.
Jedec, "UFS Specification", version 0.1, Nov. 11, 2009.
SD Group and SD Card Association, "SD Specifications Part 1 Physical Layer Specification", version 3.01, draft 1.00, Nov. 9, 2009.
Compaq et al., "Universal Serial Bus Specification", revision 2.0, Apr. 27, 2000.
Serial ATA International Organization, "Serial ATA Revision 3.0 Specification", Jun. 2, 2009.
Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.
U.S. Appl. No. 12/880,101 "Reuse of Host Hibernation Storage Space by Memory Controller", filed Sep. 12, 2010.
U.S. Appl. No. 12/890,724 "Error Correction Coding Over Multiple Memory Pages", filed Sep. 27, 2010.
U.S. Appl. No. 12/171,797 Official Action dated Aug. 25, 2010.
U.S. Appl. No. 12/497,707 Official Action dated Sep. 15, 2010.
U.S. Appl. No. 11/995,801 Official Action dated Oct. 15, 2010.
Numonyx, "M25PE16: 16-Mbit, page-erasable serial flash memory with byte-alterability, 75 MHz SPI bus, standard pinout", Apr. 2008.
U.S. Appl. No. 11/995,814 Official Action dated Dec. 17, 2010.
U.S. Appl. No. 12/388,528 Official Action dated Nov. 29, 2010.
U.S. Appl. No. 12/251,471 Official Action dated Jan. 3, 2011.
Engineering Windows 7, "Support and Q&A for Solid-State Drives", e7blog, May 5, 2009.
Micron Technology Inc., "Memory Management in NAND Flash Arrays", Technical Note, year 2005.
Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.
Park et al., "Sub-Grouped Superblock Management for High-Performance Flash Storages", IEICE Electronics Express, vol. 6, No. 6, pp. 297-303, Mar. 25, 2009.
"How to Resolve "Bad Super Block: Magic Number Wrong" in BSD", Free Online Articles Director Article Base, posted Sep. 5, 2009.
Ubuntu Forums, "Memory Stick Failed IO Superblock", posted Nov. 11, 2009.
Super User Forums, "SD Card Failure, can't read superblock", posted Aug. 8, 2010.
U.S. Appl. No. 12/987,174, filed Jan. 10, 2011.
U.S. Appl. No. 12/987,175, filed Jan. 10, 2011.
U.S. Appl. No. 12/963,649, filed Dec. 9, 2010.
U.S. Appl. No. 13/021,754, filed Feb. 6, 2011.
Agrell et al., "Closest Point Search in Lattices", IEEE Transactions on Information Theory, vol. 48, No. 8, pp. 2201-2214, Aug. 2002.
Blahut, R.E., "Theory and Practice of Error Control Codes," Addison-Wesley, May 1984, section 3.2, pp. 47-48.
Chang, L., "Hybrid Solid State Disks: Combining Heterogeneous NAND Flash in Large SSDs", ASPDAC, Jan. 2008.
Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.
Databahn™, "Flash memory controller IP", Denali Software, Inc., 1994 https://www.denali.com/en/products/databahn_flash.jsp.
Datalight, Inc., "FlashFX Pro 3.1 High Performance Flash Manager for Rapid Development of Reliable Products", Nov. 16, 2006.
Duann, N., Silicon Motion Presentation "SLC & MLC Hybrid", Flash Memory Summit, Santa Clara, USA, Aug. 2008.
Engh et al., "A self adaptive programming method with 5 mV accuracy for multi-level storage in FLASH", pp. 115-118, Proceedings of the IEEE 2002 Custom Integrated Circuits Conference, May 12-15, 2002.
Goodman et al., "On-Chip ECC for Multi-Level Random Access Memories," Proceedings of the IEEE/CAM Information Theory Workshop, Ithaca, USA, Jun. 25-29, 1989.
Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.
Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.
Horstein, "On the Design of Signals for Sequential and Nonsequential Detection Systems with Feedback," IEEE Transactions on Information Theory IT-12:4 (Oct. 1966), pp. 448-455.
Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.
Kawaguchi et al. 1995. A flash-memory based file system. In Proceedings of the USENIX 1995 Technical Conference, New Orleans, Louisiana. 155-164.
Mielke et al., "Recovery Effects in the Distributed Cycling of Flash Memories", IEEE 44th Annual International Reliability Physics Symposium, pp. 29-35, San Jose, USA, Mar. 2006.
ONFI, "Open NAND Flash Interface Specification," revision 1.0, Dec. 28, 2006.
Phison Electronics Corporation, "PS8000 Controller Specification (for SD Card)", revision 1.2, Document No. S-07018, Mar. 28, 2007.
Shalvi, et al., "Signal Codes," Proceedings of the 2003 IEEE Information Theory Workshop (ITW'2003), Paris, France, Mar. 31-Apr. 4, 2003.
Shiozaki, A., "Adaptive Type-II Hybrid Broadcast ARQ System", IEEE Transactions on Communications, vol. 44, Issue 4, pp. 420-422, Apr. 1996.
Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.
ST Microelectronics, "Bad Block Management in NAND Flash Memories", Application note AN-1819, Geneva, Switzerland, May 2004.
ST Microelectronics, "Wear Leveling in Single Level Cell NAND Flash Memories," Application note AN-1822 Geneva, Switzerland, Feb. 2007.
Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.
Wu et al., "eNVy: A non-Volatile, Main Memory Storage System", Proceedings of the 6th International Conference on Architectural support for programming languages and operating systems, pp. 86-87, San Jose, USA, 1994.
International Application PCT/IL2007/000575 Patentability report dated Mar. 26, 2009.
International Application PCT/IL2007/000575 Search Report dated May 30, 2008.
International Application PCT/IL2007/000576 Patentability Report dated Mar. 19, 2009.
International Application PCT/IL2007/000576 Search Report dated Jul. 7, 2008.
International Application PCT/IL2007/000579 Patentability report dated Mar. 10, 2009.

International Application PCT/IL2007/000579 Search report dated Jul. 3, 2008.
International Application PCT/IL2007/000580 Patentability Report dated Mar. 10, 2009.
International Application PCT/IL2007/000580 Search Report dated Sep. 11, 2008.
International Application PCT/IL2007/000581 Patentability Report dated Mar. 26, 2009.
International Application PCT/IL2007/000581 Search Report dated Aug. 25, 2008.
International Application PCT/IL2007/001059 Patentability report dated Apr. 19, 2009.
International Application PCT/IL2007/001059 Search report dated Aug. 7, 2008.
International Application PCT/IL2007/001315 search report dated Aug. 7, 2008.
International Application PCT/IL2007/001315 Patentability Report dated May 5, 2009.
International Application PCT/IL2007/001316 Search report dated Jul. 22, 2008.
International Application PCT/IL2007/001316 Patentability Report dated May 5, 2009.
International Application PCT/IL2007/001488 Search report dated Jun. 20, 2008.
International Application PCT/IL2008/000329 Search report dated Nov. 25, 2008.
International Application PCT/IL2008/000519 Search report dated Nov. 20, 2008.
International Application PCT/IL2008/001188 Search Report dated Jan. 28, 2009.
International Application PCT/IL2008/001356 Search Report dated Feb. 3, 2009.
International Application PCT/IL2008/001446 Search report dated Feb. 20, 2009.
Sommer, N., U.S. Appl. No. 12/364,531 "Parameter Estimation Based on Error Correction Code Parity Check Equations" filed Feb. 3, 2009.
Perlmutter et al., U.S. Appl. No. 12/388,528 "Programming of Analog Memory Cells Using a Single Programming Pulse per State Transition" filed Feb. 19, 2009.
Perlmutter et al., U.S. Appl. No. 12/390,522 "Programming Analog Memory Cells for Reduced Variance After Retention" filed Feb. 23, 2009.
Perlmutter et al., U.S. Appl. No. 12/405,275 "Memory Device with Multiple-Accuracy Read Commands" filed Mar. 17, 2009.
Perlmutter et al., U.S. Appl. No. 12/397,368 "Efficient Readout from Analog Memory Cells Using Data Compression" filed Mar. 4, 2009.
Sommer, N., U.S. Appl. No. 12/171,797 "Memory Device with Non-Uniform Programming Levels" filed Jul. 11, 2008.
Shalvi et al., U.S. Appl. No. 12/251,471 "Compensation for Voltage Drifts in Analog Memory Cells" filed Oct. 15, 2008.
Huffman, A., "Non-Volatile Memory Host Controller Interface (NVMHCI)", Specification 1.0, Apr. 14, 2008.
Panchbhai et al., "Improving Reliability of NAND Based Flash Memory Using Hybrid SLC/MLC Device", Project Proposal for CSci 8980—Advanced Storage Systems, University of Minnesota, USA, Spring 2009.
U.S. Appl. No. 11/957,970 Official Action dated May 20, 2010.
Shalvi et al., U.S. Appl. No. 12/822,207 "Adaptive Over-Provisioning in Memory Systems" filed Jun. 24, 2010.
U.S. Appl. No. 12/534,898 Official Action dated Mar. 23, 2011.
U.S. Appl. No. 13/047,822, filed Mar. 15, 2011.
U.S. Appl. No. 13/069,406, filed Mar. 23, 2011.
U.S. Appl. No. 13/088,361, filed Apr. 17, 2011.
Ankolekar et al., "Multibit Error-Correction Methods for Latency-Constrained Flash Memory Systems", IEEE Transactions on Device and Materials Reliability, vol. 10, No. 1, pp. 33-39, Mar. 2010.
U.S. Appl. No. 12/344,233 Official Action dated Jun. 24, 2011.
CN Patent Application # 200780026181.3 Official Action dated Apr. 8, 2011.
Berman et al., "Mitigating Inter-Cell Coupling Effects in MLC NAND Flash via Constrained Coding", Flash Memory Summit, Santa Clara, USA, Aug. 19, 2010.
U.S. Appl. No. 12/178,318 Official Action dated May 31, 2011.
Wei, L., "Trellis-Coded Modulation With Multidimensional Constellations", IEEE Transactions on Information Theory, vol. IT-33, No. 4, pp. 483-501, Jul. 1987.
U.S. Appl. No. 13/114,049 Official Action dated Sep. 12, 2011.
U.S. Appl. No. 12/405,275 Official Action dated Jul. 29, 2011.
US 7,161,836, 01/2007, Wan et al. (withdrawn)

* cited by examiner

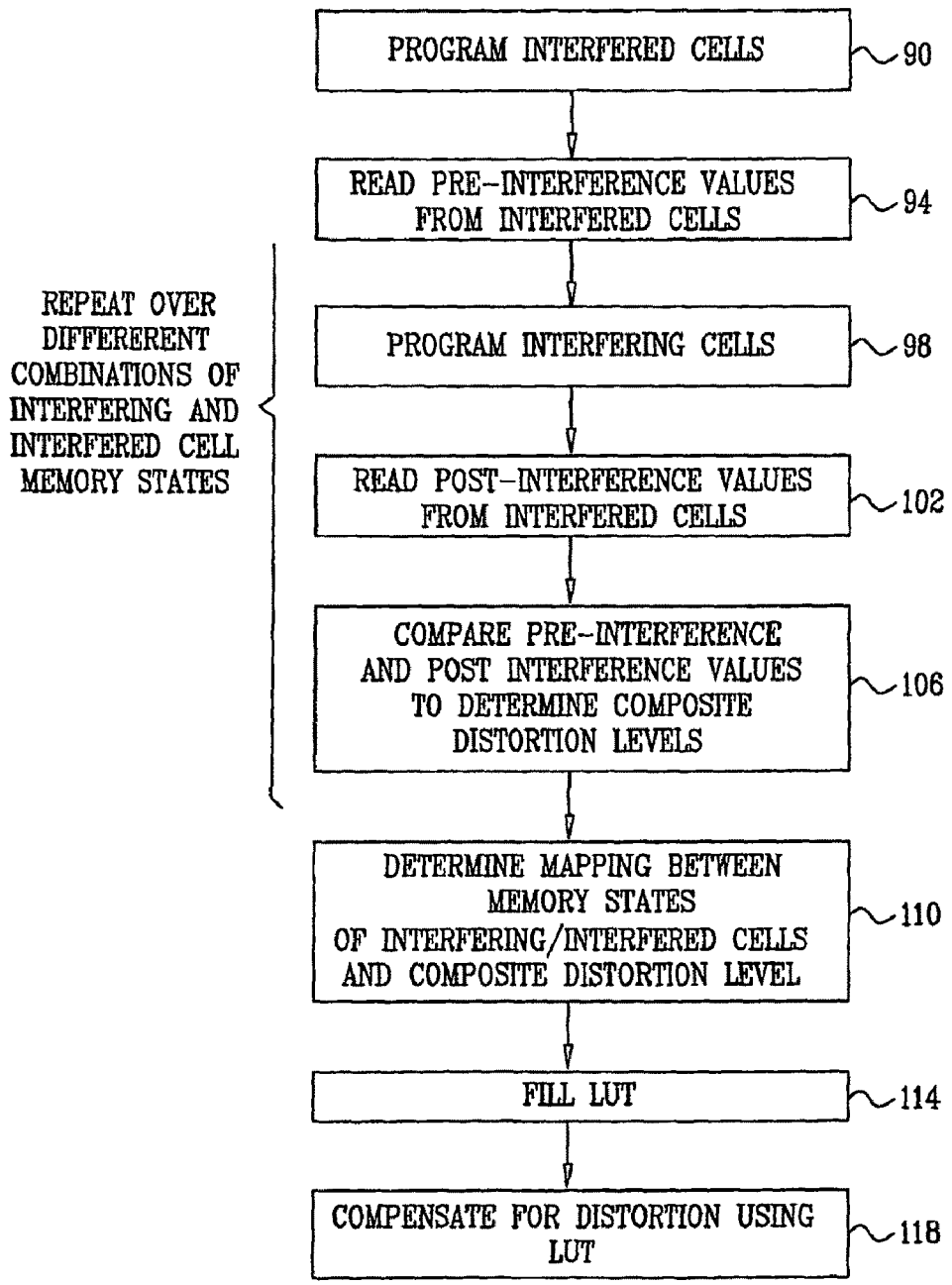

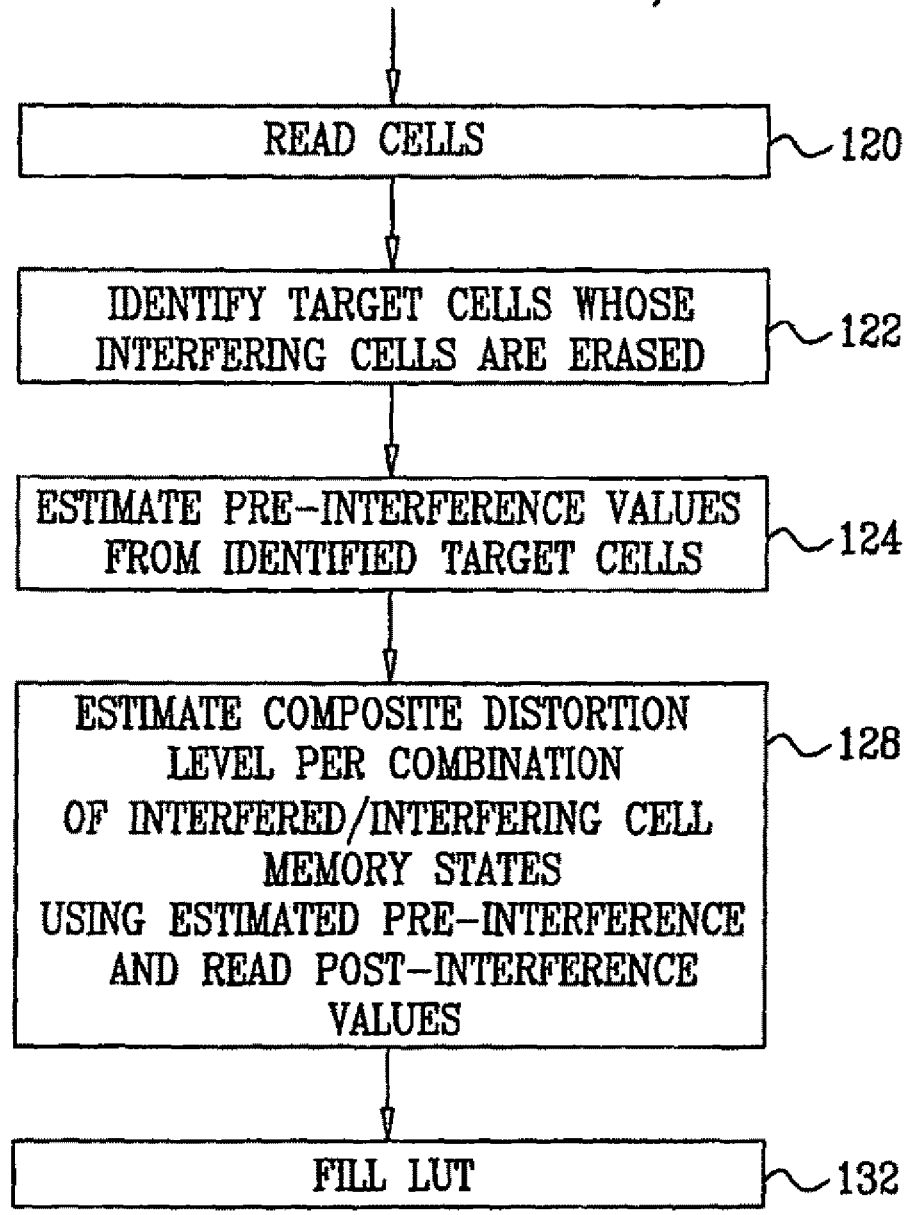

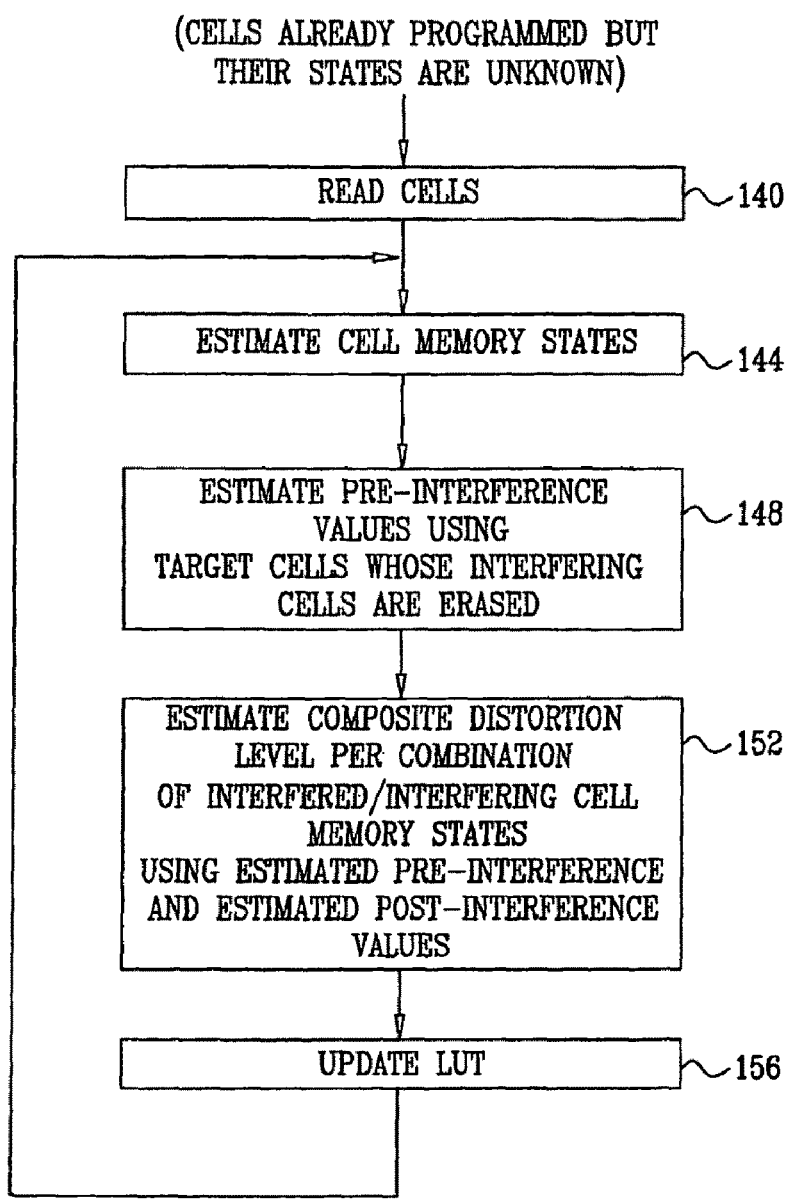

ESTIMATION OF NON-LINEAR DISTORTION IN MEMORY DEVICES

CROSS-REFERENCE TO RELATED APPLICATIONS

This application claims the benefit of U.S. Provisional Patent Application 60/867,399, filed Nov. 28, 2006, U.S. Provisional Patent Application 60/823,650, filed Aug. 27, 2006, and U.S. Provisional Patent Application 60/939,077, filed May 20, 2007, whose disclosures are incorporated herein by reference.

FIELD OF THE INVENTION

The present invention relates generally to memory devices, and particularly to methods and systems for estimating and compensating for distortion in memory devices.

BACKGROUND OF THE INVENTION

Several types of memory devices, such as Flash memories, use arrays of analog memory cells for storing data. Each analog memory cell stores a quantity of an analog value, such as an electrical charge or voltage, which represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits. The possible bit values that can be stored in an analog memory cell are also referred to as the memory states of the cell.

Some memory devices, commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the $24^{th}$ International Conference on Microelectronics (MIEL), Nis, Serbia and Montenegro, May 16-19, 2004, volume 1, pages 377-384, which is incorporated herein by reference.

The analog values read from analog memory cells are sometimes distorted. The distortion may be due to various reasons, such as electrical field coupling from neighboring memory cells, disturb noise caused by memory access operations on other cells in the array and threshold voltage drift caused by device aging. Some common distortion mechanisms are described in the article by Bez et al., cited above. Distortion effects are also described by Lee et al., in "Effects of Floating Gate Interference on NAND Flash Memory Cell Operation," IEEE Electron Device Letters, (23:5), May, 2002, pages 264-266, which is incorporated herein by reference.

Several techniques for interference cancellation in memory devices are known in the art. For example, U.S. Pat. No. 5,867,429, whose disclosure is incorporated herein by reference, describes a method for compensating for electric field coupling between floating gates of a high density Flash Electrically Erasable Programmable Read Only Memory (EEPROM) cell array. According to the disclosed method, a reading of a cell is compensated by first reading the states of all cells that are field-coupled with the cell being read. A number related to either the floating gate voltage or the state of each coupled cell is then multiplied by the coupling ratio between the cells. The breakpoint levels between states for each of the cells are adjusted by an amount that compensates for the voltage coupled from adjacent cells.

U.S. Patent Application Publication 2004/0057285, whose disclosure is incorporated herein by reference, describes a memory device and a method, which allow programming and sensing a plurality of memory cells in parallel, in order to minimize errors caused by coupling from fields of neighboring cells. The memory device and method have the plurality of memory cells linked by the same word line and a read/write circuit is coupled to each memory cells in a contiguous manner. A memory cell and its neighbors are programmed together and the field environment for each memory cell relative to its neighbors during programming and subsequent reading is less varying.

U.S. Patent Application Publication 2005/0162913, whose disclosure is incorporated herein by reference, describes a method for reading a non-volatile memory arranged in columns and rows, which reduces adjacent cell coupling. A bit to be read in a word-line is selected. An adjacent word line written after the word line is read. The selected bit in the word line is read by selectively adjusting at least one read parameter, such as a sense voltage, a pre-charge voltage or both.

U.S. Pat. No. 7,193,898, whose disclosure is incorporated herein by reference, describes a read process for a selected memory cell, which takes into account the state of one or more adjacent memory cells. If an adjacent memory cell is in one or more of a predetermined set of programmed states, an initialization voltage is provided to the bit line of the programmed adjacent memory cell to induce a compensation current between the bit line of the programmed adjacent memory cell and the bit line of the selected memory cell.

SUMMARY OF THE INVENTION

A method for operating a memory in accordance with an embodiment of the present invention includes:

storing data in analog memory cells of the memory by writing respective analog values to the analog memory cells;

identifying a set of the analog memory cells including an interfered cell having a distortion that is statistically correlated with the respective analog values of the analog memory cells in the set;

determining a mapping between combinations of possible analog values of the analog memory cells in the set and statistical characteristics of composite distortion levels present in the interfered memory cell; and applying the determined mapping so as to compensate for the distortion in the interfered memory cell.

In a disclosed embodiment, the combinations of the possible analog values used in determining the mapping include the possible analog values of the interfered memory cell.

Typically, the memory cells in the set have respective spatial relationships with respect to the interfered memory cell, and determining the mapping includes, for a target combination among the combinations of the possible analog values, measuring multiple values of the composite distortion levels caused in multiple other interfered memory cells by respective other sets of memory cells, which have the spatial relationship with respect to the respective other interfered memory cells and have the target combination of the analog values, and processing the multiple values of the composite distortion levels to determine a composite distortion level to which the target combination is mapped. In one embodiment, determining the mapping includes estimating drift levels of the analog values in the interfered memory cells corresponding to the combinations of the possible analog values, and applying the mapping includes compensating for the distortion using the estimated drift levels.

Additionally or alternatively, storing the data includes programming the analog memory cells to assume respective discrete memory states, and determining the mapping includes determining the mapping as a function of combinations of possible memory states of the memory cells in the set and the composite distortion levels present in the interfered memory cell when the memory cells in the set assume the combinations of the possible memory states.

In some embodiments, measuring the multiple values of the composite distortion levels includes programming the other interfered memory cells without programming the other sets of the memory cells, reading the analog values from the other interfered memory cells prior to completing programming of the other sets of the memory cells, programming the other sets of the memory cells, reading the analog values from the other interfered memory cells after the other sets of the memory cells have been programmed, and computing the values of the composite distortion levels by comparing the analog values read when the other sets of the memory cells are not programmed to the respective analog values read after the other sets of the memory cells have been programmed.

Typically, reading the analog values prior to completing the programming includes reading the analog values while the other sets of the memory cells are in an erased state. Alternatively or additionally, reading the analog values prior to completing the programming includes reading the analog values while the other sets of the memory cells are in a partially-programmed state. Further alternatively or additionally, reading the analog values prior to completing the programming includes reading the analog values after some of the memory cells in the other sets of the memory cells have been programmed.

In some embodiments, measuring the multiple values of the composite distortion levels includes reading the analog values from the other interfered memory cells and from the other sets of the memory cells, identifying a subset of the other interfered memory cells whose respective sets of the memory cells are not programmed, and computing the values of the composite distortion levels by comparing the analog values read from the memory cells in the subset to the analog values read from some of the other interfered memory cells, whose respective sets of the memory cells are programmed to assume the target combination of the memory states.

In other embodiments, measuring the multiple values of the composite distortion levels includes reading the analog values from the other interfered memory cells and from the other sets of the memory cells, processing the read analog values to estimate the memory states of the other interfered memory cells and of the other sets of the memory cells, identifying a subset of the other interfered memory cells whose respective sets of the memory cells are not programmed, and computing the values of the composite distortion levels by comparing the analog values read from the memory cells in the subset to the analog values read from some of the other interfered memory cells, whose respective sets of the memory cells are estimated to have the target combination of the memory states. The method may include re-estimating the memory states of the other interfered memory cells and of the other sets of the memory cells, and updating the mapping based on the re-estimated memory states.

Additionally or alternatively, determining the mapping includes dividing a range of the analog values into a number of regions higher than a number of the possible memory states, and determining the mapping between combinations of possible regions in which the analog values of the memory cells in the set fall and the composite distortion levels caused in the interfered memory cell by the set of the memory cells when the analog values written thereto are within the combination of the regions.

In a disclosed embodiment, determining the mapping includes storing the mapping in a Look-Up Table (LUT) that is accessed based on the combinations of the possible analog values. Alternatively, determining the mapping includes expressing the mapping by a mapping function, which produces the respective composite distortion levels responsively to the combinations of the possible analog values.

Typically, applying the mapping includes determining a current combination of the analog values of the memory cells in the set, applying the mapping to the current combination to produce an estimate of the distortion level in the interfered memory cell, and compensating for the distortion in the interfered memory cell based on the estimate. In one embodiment, compensating for the distortion includes subtracting the estimate from an analog value read from the interfered memory cell. In another embodiment, compensating for the distortion includes determining a read threshold used for reading an analog value from the interfered memory cell based on the estimate. Additionally or alternatively the data stored in the analog memory cells may be encoded with an Error Correction Code (ECC), and compensating for the distortion may include computing a metric used for decoding the ECC based on the estimate.

In a disclosed embodiment, determining the mapping includes adaptively updating the mapping over time.

Typically, determining the mapping includes determining a statistical property of the composite distortion levels, and applying the mapping includes compensating for the distortion in the interfered memory cell responsively to the statistical property.

In one embodiment, determining the mapping includes determining a first mapping that applies to the memory cells located in a first area of the memory, and a second mapping that applies to the memory cells located in a second area of the memory different from the first area. Additionally or alternatively, when the distortion in the interfered memory cell is caused by first and second different distortion mechanisms, determining the mapping includes determining first and second mappings that respectively correspond to the first and second distortion mechanisms. Further additionally or alternatively, determining the mapping includes determining a first mapping that applies to a first order of programming the interfered memory cell with respect to programming the memory cells in the set, and a second mapping that applies to a second order of programming the interfered memory cell with respect to programming the memory cells in the set, different from the first order.

In one embodiment, the statistical characteristics include a mean distortion level.

In a disclosed embodiment, determining the mapping includes measuring the statistical characteristics of the composite distortion levels after installation of the memory in a host system, responsively to operation of the memory in the host system.

There is also provided, in accordance with an embodiment of the present invention, a data storage apparatus, including:
an interface, which is operative to communicate with a memory that includes a plurality of analog memory cells; and
a memory signal processor (MSP), which is connected to the interface and is coupled to store data in the analog memory cells of the memory by writing respective analog values to the analog memory cells, to determine, for a set of the analog memory cells including an interfered cell having a distortion that is statistically correlated with the respective analog values of the analog memory cells in the set, a mapping between combinations of possible analog values of the analog memory cells in the set and statistical characteristics of composite distortion levels present in the interfered memory cell, and to apply the determined mapping so as to compensate for the distortion in the interfered memory cell.

There is additionally provided, in accordance with an embodiment of the present invention, a data storage apparatus, including:
a memory, which includes a plurality of analog memory cells; and
a memory signal processor (MSP), which is connected to the memory and is coupled to store data in the analog memory cells of the memory by writing respective analog values to the analog memory cells, to determine, for a set of the analog memory cells including an interfered cell having a distortion that is statistically correlated with the respective analog values of the analog memory cells in the set, a mapping between combinations of possible analog values of the analog memory cells in the set and statistical characteristics of composite distortion levels present in the interfered memory cell, and to apply the determined mapping so as to compensate for the distortion in the interfered memory cell.

The present invention will be more fully understood from the following detailed description of the embodiments thereof, taken together with the drawings in which:

BRIEF DESCRIPTION OF THE DRAWINGS

FIGS. 3-5 are flow charts that schematically illustrate methods for estimating and compensating for distortion in a memory cell array, in accordance with embodiments of the present invention.

DETAILED DESCRIPTION OF EMBODIMENTS

Overview

Figure 1:
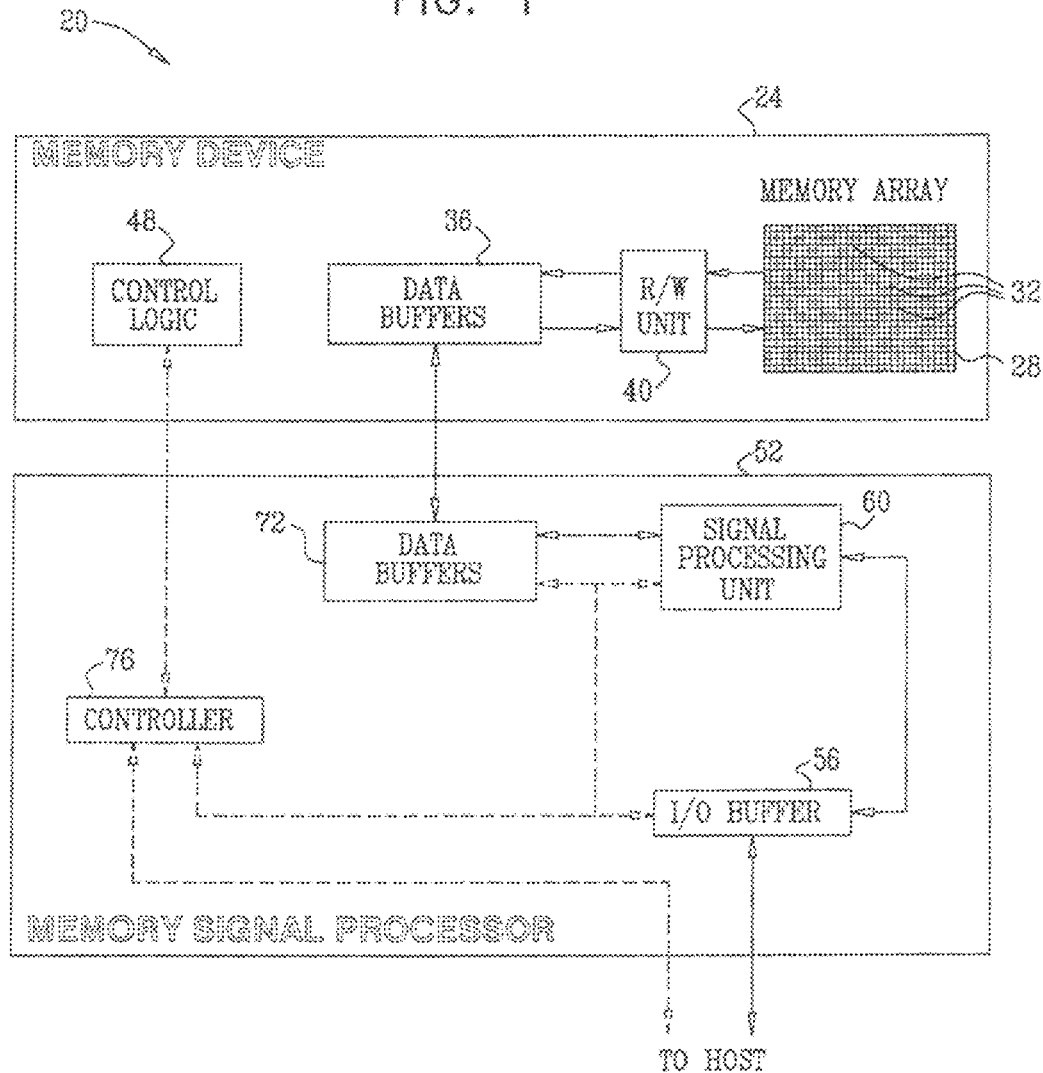
FIG. 1 is a block diagram that schematically illustrates a system for memory signal processing, in accordance with an embodiment of the present invention.

In many practical implementations of analog memory cell arrays, each memory cell is subject to distortion from multiple interfering cells, which may or may not be adjacent to the interfered cell in the array. The distortion mechanisms are often non-linear, i.e., the composite distortion inflicted on a certain interfered cell by multiple interfering cells cannot be modeled as a linear combination of the individual distortion contributions of the interfering cells.

In general, the composite distortion level in a certain interfered cell can be modeled as a function of the particular combination of the analog values of the interfering cells. In some cases, the function also depends on the analog value of the interfered cell. Instead of modeling the distortion based on the combination of analog values, the distortion can be approximated based on the memory states of the cells. Thus, the composite distortion inflicted on an interfered cell by a group of interfering cells can be modeled as a function of the combination of memory states of the interfering cells, and possibly of the interfered cell. In many practical cases, the distortion mechanism is stationary across the array or parts thereof, such as across an erasure block. In other words, any group of interfered cell and associated interfering cells having a certain combination of memory states would produce similar distortion in the interfered cell.

Embodiments of the present invention provide improved methods and systems for estimating and compensating for distortion in arrays of analog memory cells. The methods and systems described herein make use of the fact that the distortion in a memory cell can be modeled as a function of the memory states, or of the analog values, of the interfering cells. Although the methods described herein are particularly suitable for estimating non-linear distortion, they can be used for estimating linear distortion, as well.

In some embodiments, a Memory Signal Processor (MSP) writes data to an array of analog memory cells and reads data from the array. In particular, the MSP estimates the distortion in the memory cells and compensates for the estimated distortion when reading and/or writing data. The MSP typically calculates a mapping between the possible combinations of the analog values and/or memory states of the interfering cells and the resulting composite distortion level in the interfered cell. The mapping may also depend on the analog value and/or memory state of the interfered cell itself. The mapping is sometimes represented by a Look-Up Table (LUT), whose rows correspond to the different memory state combinations.

Alternatively, the mapping can be represented using other means, such as by fitting a mapping function, which may be a polynomial function, to the memory state combinations and the resulting distortion levels. In some cases, the mapping is calculated as a function of the analog values stored in the interfering cells, or of various approximations of these values, rather than as a function of the corresponding memory states.

Several exemplary methods for estimating the mean distortion, as well as other statistical properties of the distortion, for different memory state combinations are described herein. Some of these methods assume a-priori knowledge of the memory states of the memory cells and/or of the pre-interference values, i.e., the analog values stored in the memory cells without the effects of distortion. Other disclosed methods do not assume such knowledge. In some embodiments, distortion estimation is carried out iteratively, in order to improve the estimation accuracy and track changes in the distortion mechanisms.

The MSP may compensate for the estimated distortion in a number of ways. For example, the MSP may directly subtract the estimated distortion level from the values read from the memory cells and/or modify reading thresholds that are used in the reading process based on the estimated distortion. When the data written into the memory is encoded using an Error Correction Code (ECC), the MSP can adjust metrics that are used in the ECC decoding process responsively to the estimated distortion.

The estimation and compensation methods described herein can be used at different stages along the lifetime of the memory array, such as during or after production, during initialization and/or during normal data storage operation in a host system. A wide variety of distortion types, such as cross-coupling interference and disturb noise, can be accurately estimated and compensated for.

System Description

FIG. 1 is a block diagram that schematically illustrates a system 20 for memory signal processing, in accordance with an embodiment of the present invention. System 20 can be used in various host systems and devices, such as in computing devices, cellular phones or other communication terminals, removable memory modules ("disk-on-key" devices), digital cameras, music and other media players and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and CTF Flash cells, PCM, NROM, FRAM, MRAM and DRAM cells. The charge levels stored in the cells and/or the analog voltages written into and read out of the cells are referred to herein collectively as analog values.

Data for storage in memory device 24 is provided to the device and cached in data buffers 36. The data is then converted to analog voltages and written into memory cells 32 using a reading/writing (R/W) unit 40, whose functionality is described in greater detail below. When reading data out of array 28, R/W unit 40 converts the electrical charge, and thus the analog voltages of memory cells 32, into digital samples. Each sample has a resolution of one or more bits. The samples are cached in buffers 36. The operation and timing of memory device 24 is managed by control logic 48.

The storage and retrieval of data in and out of memory device 24 is performed by a Memory Signal Processor (MSP) 52. MSP 52 comprises a signal processing unit 60, which processes the data that is written into and retrieved from device 24. In particular, unit 60 estimates the distortion that affects the analog values stored in cells 32, and compensates for the effect of the estimated distortion.

MSP 52 comprises a data buffer 72, which is used by unit 60 for storing data and for interfacing with memory device 24. MSP 52 also comprises an Input/Output (I/O) buffer 56, which forms an interface between the MSP and the host system. A controller 76 manages the operation and timing of MSP 52. Signal processing unit 60 and controller 76 may be implemented in hardware. Alternatively, unit 60 and/or controller 76 may comprise microprocessors that run suitable software, or a combination of hardware and software elements.

The configuration of FIG. 1 is an exemplary system configuration, which is shown purely for the sake of conceptual clarity. Any other suitable configuration can also be used. Elements that are not necessary for understanding the principles of the present invention, such as various interfaces, addressing circuits, timing and sequencing circuits, data scrambling circuits, error correction encoding/decoding circuits and debugging circuits, have been omitted from the figure for clarity.

In the exemplary system configuration shown in FIG. 1, memory device 24 and MSP 52 are implemented as two separate Integrated Circuits (ICs). In alternative embodiments, however, the memory device and MSP may be integrated on separate semiconductor dies in a single Multi-Chip Package (MCP) or System on Chip (SoC). Further alternatively, some or all of the MSP circuitry may reside on the same die on which memory array 28 is disposed. Further alternatively, some or all of the functionality of MSP 52 can be implemented in software and carried out by a processor or other element of the host system. In some implementations, a single MSP 52 may be connected to multiple memory devices 24. Additional architectural aspects of certain embodiments of system 20 are described in greater detail in U.S. Provisional Patent Application 60/867,399, cited above.

In a typical writing operation, data to be written into memory device 24 is accepted from the host and cached in I/O buffer 56. The data is transferred, via data buffers 72, to memory device 24. The data may be pre-processed by MSP 52 before it is transferred to the memory device for programming. For example, unit 60 may encode the data using an Error Correction Code (ECC) and/or scramble the data. In device 24 the data is temporarily stored in buffers 36. R/W unit 40 converts the data to nominal analog values and writes the nominal values into the appropriate cells 32 of array 28.

In a typical reading operation, R/W unit 40 reads analog values out of the appropriate memory cells 32 and converts them to soft digital samples. The samples are cached in buffers 36 and transferred to buffers 72 of MSP 52. In some embodiments, unit 60 of MSP 52 converts the samples to data bits. As noted above, the range of possible analog values is divided into two or more regions, with each region representing a certain combination of one or more data bits. When reading a memory cell, unit 60 typically compares the magnitude of the read sample to a set of decision thresholds, in order to determine the region in which the read value falls (i.e., the memory state of the cell), and thus the data bits stored in the cell. Blocks of data are transferred from buffers 72 to unit 60. If ECC is used, unit 60 decodes the ECC of these blocks. The data is transferred via I/O buffer 56 to the host system.

Additionally, signal processing unit 60 estimates the distortion that is present in the read samples, using methods that are described hereinbelow. In some embodiments, MSP 52 scrambles the data before it is written into the memory cells, and de-scrambles the data read from the memory cells, in order to improve the distortion estimation performance.

Memory Array Structure

Figure 2:
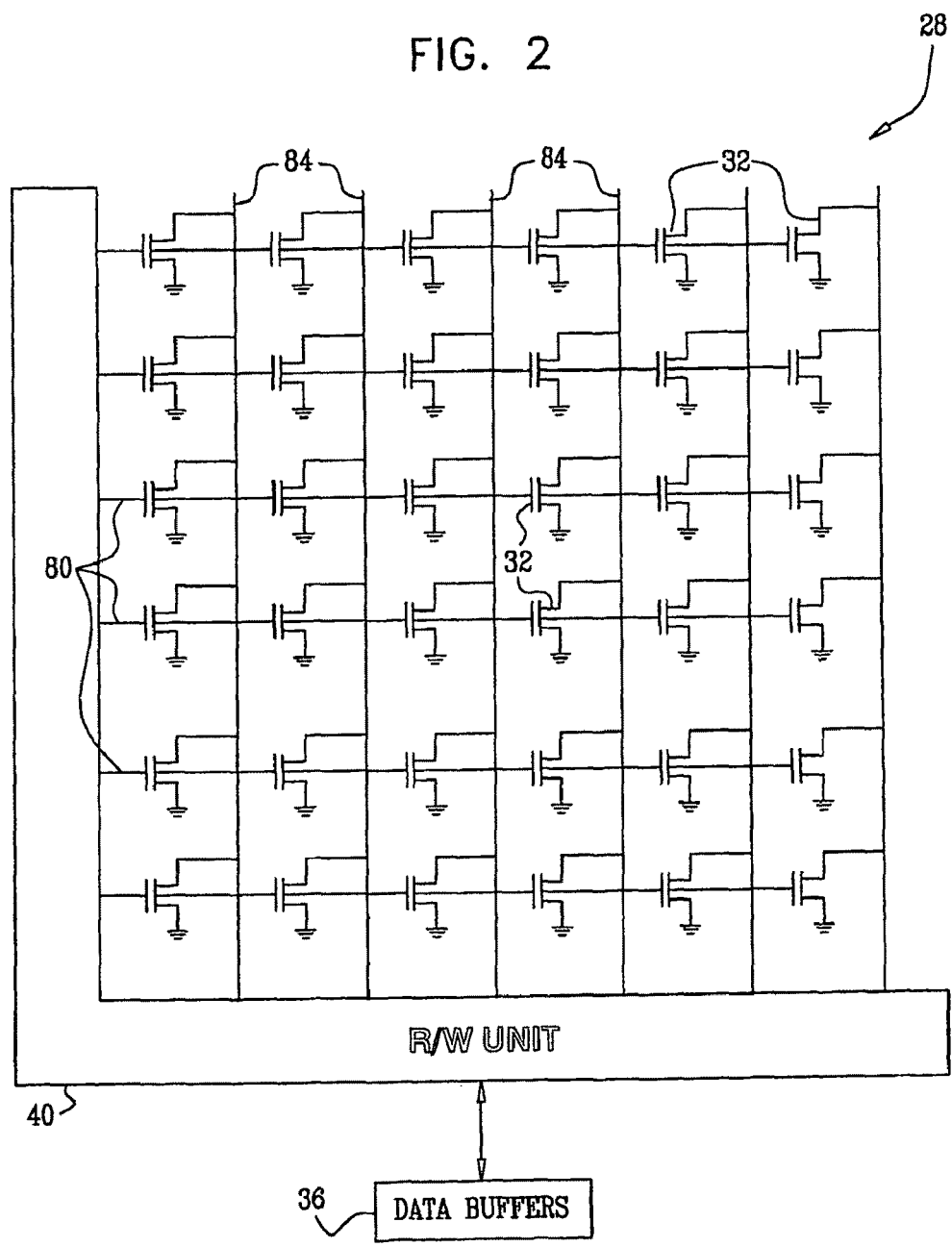
FIG. 2 is a diagram that schematically illustrates a memory cell array, in accordance with an embodiment of the present invention.

FIG. 2 is a diagram that schematically illustrates memory cell array 28, in accordance with an embodiment of the present invention. Although FIG. 2 refers to Flash memory cells that are connected in a particular array configuration, the principles of the present invention are applicable to other types of memory cells and other array configurations, as well. Some exemplary cell types and array configurations are described in the references cited in the Background section above.

Memory cells 32 of array 28 are arranged in a grid having multiple rows and columns. Each cell 32 comprises a floating gate Metal-Oxide Semiconductor (MOS) transistor. A certain amount of electrical charge (electrons or holes) can be stored in a particular cell by applying appropriate voltage levels to the transistor gate, source and drain. The value stored in the cell can be read by measuring the threshold voltage of the cell, which is defined as the minimal voltage that needs to be applied to the gate of the transistor in order to cause the transistor to conduct. The read threshold voltage is proportional to the charge stored in the cell.

In the exemplary configuration of FIG. 2, the gates of the transistors in each row are connected by word lines 80. The sources of the transistors in each column are connected by bit lines 84. In some embodiments, such as in some NOR cell devices, the sources are connected to the bit lines directly. In alternative embodiments, such as in some NAND cell devices, the bit lines are connected to strings of floating-gate cells.

Typically, R/W unit 40 reads the threshold voltage of a particular cell 32 by applying varying voltage levels to its gate (i.e., to the word line to which the cell is connected) and checking whether the drain current of the cell exceeds a certain threshold (i.e., whether the transistor conducts). Unit 40 usually applies a sequence of different voltage values to the word line to which the cell is connected, and determines the lowest gate voltage value for which the drain current exceeds the threshold. Typically, unit 40 reads a group of cells, referred to as a page, simultaneously. Alternatively, R/W unit may use any other technique or circuitry for reading and writing values to and from memory cells 32 of array 28.

The memory cell array is typically divided into multiple pages, i.e., groups of memory cells that are programmed and read simultaneously. In some embodiments, each page comprises an entire row of the array. In alternative embodiments, each row (word line) can be divided into two or more pages. For example, in some SLC devices each row is divided into two pages, one comprising the odd-order cells and the other comprising the even-order cells. Typically but not necessarily, a two-bit-per-cell memory device usually has four pages per row, a three-bit-per-cell memory device has six pages per row, and a four-bit-per-cell memory device has eight pages per row. Erasing of cells is usually carried out in blocks that contain multiple pages. Typical memory devices may comprise several thousand erasure blocks. In a typical two-bit-per-cell MLC device, each erasure block is on the order of 32 word lines, each comprising several thousand cells. Each word line is often partitioned into four pages (odd/even order cells, least/most significant bit of the cells). Alternatively, other block sizes and configurations can also be used. Three-bit-per cell devices often have 192 pages per erasure block, and four-bit-per-cell devices often have 256 pages per block.

Memory Cell Distortion Mechanisms

The analog values (e.g., threshold voltages) stored in memory cells 32 may contain various types of distortion, which are caused by different distortion mechanisms in array 28. For example, electrical cross-coupling between nearby cells in the array may modify the threshold voltage of a particular cell. As another example, electrical charge may leak from the cells over time. As a result of this aging effect, the threshold voltage of the cells may drift over time from the initially-written value. Another type of distortion, commonly referred to as disturb noise, is caused by memory access operations (e.g., read, write or erase operations) on certain cells in the array, which cause unintended charge variations in other cells. As yet another example, the source-drain current of a particular cell can be affected by the charge in adjacent cells, e.g., other cells in the same NAND cell string, via an effect referred to as Back Pattern Dependency (BPD).

The distortion in memory cells 32 degrades the performance of the memory device, e.g., the error probability when reconstructing the data, the achievable storage capacity and/or the achievable data retention period. Performance degradation is particularly severe in MLC devices, in which the differences between the different voltage levels that represent the data are relatively small.

In many practical cases, a certain interfered cell is subject to distortion from multiple interfering cells. The interfering cells may or may not be adjacent to the interfered cell in the array. For example, cross-coupling interference usually occurs between nearby cells, although not necessarily directly adjacent to one another. Other types of distortion, such as disturb noise and BPD, may be caused by cells that belong to the same bit line or word line as, but sometimes distant from, the interfered cell.

Distortion mechanisms are often non-linear. In other words, the composite distortion inflicted on a certain interfered cell by multiple interfering cells cannot be modeled as a linear combination of the individual distortion contributions of the interfering cells. Even when the distortion is caused by only a single interfering cell, the distortion may not be linear. For example, the distortion level may depend on the analog values stored in both the interfering cell and the interfered cell. The dependence may be an arbitrary, often non-linear function. In general, it is possible to model the composite distortion level in a certain interfered cell depending on the particular combination of the analog values of the (one or more) interfering cells and the interfered cell.

Instead of modeling the distortion based on the combination of analog values stored in the interfered cell and the interfering cells, the distortion can be approximated based on the memory states of the cells. Thus, the composite distortion inflicted on an interfered cell by a group of interfering cells can be assumed to depend on the combination of memory states of the interfered cell and the interfering cells.

In many practical cases, the distortion mechanism is stationary across the array or across an area of the array, such as across an erasure block or across a certain word line within the block. In other words, any interfered cell and associated interfering cells, which have a certain spatial relationship in the array and a certain combination of memory states, would produce similar distortion in the interfered cell. For example, when the distortion in a cell is caused by its eight nearest neighbors, the dependence of the composite distortion level on the particular combination of nine memory states is often similar across the array or erasure block. This condition often holds for other spatial or geometrical relationships between interfering and interfered cells, such as interfering cells that belong to the same row or column (word or bit line) as the interfered cell.

Distortion Estimation Methods

Embodiments of the present invention provide improved methods and systems for estimating the distortion levels in memory cell array 28. The methods and systems described herein are particularly suitable for estimating non-linear distortion, although they can be used to estimate linear distortion, as well.

In some embodiments, MSP 52 calculates and maintains a mapping between combinations of memory states of one or more interfering cells and the resulting composite distortion levels. The mapping may also depend on the memory state of the interfered cell. When reading data out of the memory cells, the MSP uses the mapping to compensate for the distortion.

For example, consider an MLC array storing two bits per cell. Each analog memory cell in the array can be programmed to assume one of four possible memory states denoted 0 ... 3. In this exemplary array, each memory cell is subject to distortion from three interfering cells, namely its left-hand-side, right-hand-side and next-row neighbors. Assuming the composite distortion depends on the memory states of the interfered cell and of the three interfering cells, the total number of combinations of possible memory states is $4^{(3+1)}=256$. Each combination of memory states produces a particular composite distortion level in the interfered cell. The distortion is assumed to be stationary across the array, i.e., any memory cell and its left-hand-side, right-hand-side and next-row neighbors having a given combination of memory states would produce similar distortion in the memory cell.

In the present example, MSP 52 calculates and maintains a mapping between the 256 memory state combinations and the corresponding composite distortion levels. The MSP may maintain the mapping in a Look-Up Table (LUT) that is accessed by the memory state combinations, by evaluating a multidimensional mapping function such as a polynomial function, or using any other suitable method. For example, the MSP may use the following 256-row LUT:

| Memory state of interfered cell | Memory state of left-hand-side neighbor | Memory state of right-hand-side neighbor | Memory state of next-row neighbor | Composite distortion level in interfered cell (Volts) |
|---|---|---|---|---|
| 0 | 0 | 0 | 0 | 0 |
| 0 | 0 | 0 | 1 | 0.01 |
| . | . | . | . | . |
| . | . | . | . | . |
| . | . | . | . | . |
| 3 | 3 | 3 | 2 | 0.15 |
| 3 | 3 | 3 | 3 | 0.16 |

FIGS. 3-5 below describe exemplary methods for calculating the LUT entries, i.e., the composite distortion levels that correspond to the different memory state combinations. Although the embodiments described below refer to LUT implementations, the methods described herein can be similarly used with any other mapping representation.

In some embodiments, MSP 52 may use multiple LUTs for different areas of the array and/or for different types of memory cells that exhibit different distortion characteristics. For example, the distortion in even-order rows (word lines) may be different from the distortion in odd-order rows. Even-order columns (bit lines) may differ from odd-order columns. Cells located along the perimeter of an erasure block (e.g., first/last row, first/last column) may exhibit different distortion characteristics. Thus, MSP 52 may comprise a separate LUT for each different cell type.

Additionally or alternatively, the MSP may hold multiple LUTs (or mapping functions) corresponding to various orders of programming of the interfered and interfering cells. For example, a certain LUT may correspond to cases in which the interfered cell was programmed after its vertical neighbor, and another LUT may correspond to cases in which the interfered cell was programmed before its vertical neighbor. Certain aspects of interference estimation based on the order of programming of memory cells are addressed in PCT Application PCT/IL2007/000576, entitled "Distortion Estimation and Cancellation in Memory Devices," filed May 10, 2007, whose disclosure is incorporated herein by reference.

Further additionally or alternatively, the MSP may maintain separate LUTs for different distortion mechanisms. For example, when memory cells are subject both to cross-coupling interference and to disturb noise, the MSP may maintain a separate LUT for each mechanism.

For example, a certain erasure block may have certain pages, whose cells are subject to only vertical cross-talk (i.e., cross-coupling interference from other cells along the same bit line as the interfered cell). Other pages may be subject to both vertical and horizontal cross-talk (i.e., cross-coupling interference from other cells in the same word line as the interfered cell). The pages in the last word line of the block may be subject to another, different cross-coupling mechanism. In such cases, the MSP may hold a separate LUT (or other form of mapping function) for each cross-coupling mechanism. When estimating the distortion in a certain memory cell, the MSP extracts the estimated distortion levels from one or more appropriate mechanism-specific LUTs, depending on the mechanisms that affect the cell in question. In many practical cases, the distortion caused by different distortion mechanisms is additive. Therefore, in some embodiments, the MSP sums the mean distortion levels extracted from the different mechanism-specific LUTs, to produce the total mean distortion level.

Although it is possible in principle to use a single LUT without differentiating between different mechanisms, the use of separate LUTs is often advantageous. For example, the size of each individual LUT is often considerably smaller than the size of the single LUT. In addition, the accuracy of estimating the LUT entries (composite distortion levels) can be significantly improved when each LUT addresses only a single mechanism.

In some embodiments, multiple LUTs can be looked-up in parallel, so as to increase the speed of the distortion estimation process. Any suitable granularity or resolution can be used in the LUT or other mapping representation. For example, assuming the voltage shift due to cross-coupling is in the range of ±300 mV, the distortion level can be represented at a granularity of 20 mV using a 5-bit number.

FIG. 3 is a flow chart that schematically illustrates a method for estimating and compensating for distortion in memory cell array 28, in accordance with an embodiment of the present invention. The method begins with MSP 52 programming a subset of memory cells 32 that are defined as interfered cells, without completing the programming their respective interfering cells, at a pre-interference programming step 90. The interfering cells may either be in an erased state or a partially-programmed state at this step. Alternatively, some of the interfering cells may have already been programmed. Any suitable method can be used for selecting the subset of interfered cells. For example, the MSP may select a subset of cells that are unlikely to interfere with one another, e.g., cells that are sufficiently separated from one another and belong to different bit and word lines. For example, the MSP may select a cell in every fifth word line and every fifth bit line.

The MSP programs the subset of interfered cells with known data, which may comprise, for example, pseudo-random data or a predefined data pattern. The programmed data may be scrambled or otherwise selected or manipulated, so that a sufficient number of memory cells are set to each of the possible memory states. The MSP reads the programmed interfered cells, at a pre-interference reading step 94. At this stage, the interfered cells are not subject to distortion, and the values read from the cells are regarded as pre-interference values, denoted $V_{pre}$.

The MSP now programs the memory cells that interfere with the interfered cells, at an interferer programming step 98. The data used for programming the interfering cells is known, and is typically designed especially to reproduce a wide variety of different memory state combinations of interfered and interfering memory cells.

The MSP now reads the interfered cells again, at a post-interference reading step 102. Since the interfering cells have been programmed at step 98 above, the interfered cells are now subject to distortion. The values read from the interfered cells are regarded as post-interference values, denoted $V_{post}$. The pre- and post-interference values $V_{pre}$ and $V_{post}$ are typically read with high resolution, i.e., as soft samples.

MSP 52 compares the pre- and post-interference values read from the interfered cells to determine the composite distortion levels in the cells, at a distortion calculation step 106. For a given interfered cell, the difference between $V_{post}$ and $V_{pre}$ is indicative of the composite distortion level in the cell, caused by the particular combination of memory states of the interfered cell and its interfering cells. The MSP typically repeats the process of steps 90-106 above for a large number of interfered cells.

The MSP determines a mapping from the combinations of memory states of the interfered cell and the interfering cells to the resulting distortion level, based on the multiple $V_{post}$ and $V_{pre}$ measurements, at a mapping calculation step 110. For example, the MSP may calculate the average distortion level in all interfered cells that are set to a certain memory state and whose interfering cells have a particular combination of memory states. In other words, the MSP may collect the memory state combinations corresponding to each row of the LUT described above, and average the distortion levels per row. The average distortion level that is entered at row i of the LUT can thus be written as $$V_i = \underset{j \in S_i}{E} \{V_{post}^j - V_{pre}^j\} = \frac{1}{|S_i|} \sum_{j \in S_i} V_{post}^j - V_{pre}^j. \quad [1]$$

wherein E{ } denotes statistical averaging, $S_i$ denotes the subset of interfered cells whose memory state combination corresponds to row i of the LUT, and $V_{pre}^j$ and $V_{post}^j$ denote the pre- and post-interference values read from cell j. The MSP fills the LUT with the average distortion levels evaluated at step 110 above, at a LUT updating step 114.

MSP 52 compensates for the distortion in the interfered cells based on the mapping determined at step 110 above (e.g., based on the LUT entries), at a compensation step 118. Distortion compensation can be carried out in a number of ways, as will be described further below.

The method of FIG. 3 above can be combined with the normal operation of system 20 in the host system. In some embodiments, the method can program user data instead of artificial data in the interfered and interfering cells. In these embodiments, the MSP performs additional reading operations in order to measure the pre- and post-interference values.

The method of FIG. 3 above assumes that the data written to the interfered and interfering cells, and therefore the memory states of these cells, are known a-priori. In addition, the method uses a-priori knowledge of the pre-interference values of the interfered cells. In some situations, however, the pre-interference values of the interfered cells are not known. FIGS. 4 and 5 below describe methods for estimating the distortion without assuming prior knowledge of the pre-interference values of the interfered cells. The method of FIG. 4 assumes that the data written to the cells, and therefore their memory states, are known. The method of FIG. 5 assumes that neither the memory states nor the pre-interference values of the cells are known.

The descriptions of FIGS. 4 and 5 give exemplary methods that calculate the mean distortion level and the shift (i.e., the difference between the mean distortion in the interfered cell before and after programming of the interfering cells). Additionally or alternatively, the methods of FIGS. 4 and 5 can also be used to calculate various statistical properties of the distortion for different memory state combinations of the interfering cells (and possibly the interfered cell, as well).

Such statistical properties may comprise, for example, the mean distortion value, the shift in the mean distortion value before and after programming of the interfering cells, the variance of the distortion level, the shape and parameters of the Probability Distribution Function (PDF) of the analog value stored in the interfered cells, and/or any other suitable statistical property of the distortion.

FIG. 4 is a flow chart that schematically illustrates an alternative method for estimating the distortion in memory cell array 28, in accordance with an alternative embodiment of the present invention. The method of FIG. 4 begins with the interfered and interfering memory cells already programmed; and assumes that their memory states are known. As in the method of FIG. 3 above, the programmed data may comprise pseudo-random or specially designed data. Unlike the method of FIG. 3, however, the reading operation is performed after the cells are already programmed, and therefore the pre-interference values of the cells cannot be read explicitly.

MSP 52 reads the memory cells, at a reading step 120. The read values comprise the post-interference values of the cells, since the cells have already been programmed. In order to estimate the pre-interference values, MSP 52 identifies memory cells whose interfering cells are at the erased level, at an identification step 122. The identified cells are referred to as target cells. The MSP uses the values of the identified target cells as estimates of the pre-interference values, since these cells are not subject to interference.

The MSP calculates an estimated average pre-interference value for each of the possible memory states, at a pre-interference estimation step 124. For example, the MSP can separately average the values read from the target cells that are set to each possible memory state.

MSP 52 estimates the composite distortion level for each combination of memory states of the interfered cell and associated interfering cells, at a distortion estimation step 128.

The MSP estimates the composite distortion based on the average pre-interference values calculated at step 124 above and on the post-interference values of the cells read at step 120 above.

In this situation, Equation [1] above can be written as $$V_i = \underset{j \in S_i}{E} \{V_{post}^j\} - \underset{j \in S_i}{E} \{V_{pre}^j\} = \underset{j \in S_i}{E} \{V_{post}^j\} - \overline{V}^k \qquad [2]$$

since the memory state of the interfered cell is constant within each subset $S_i$. $\overline{V}^k$ denotes the estimated pre-interference values calculated at step 124 above, and k denotes the memory state of the interfered cell in subset $S_i$. The MSP thus calculates the composite distortion levels $V_i$ in accordance with Equation [2]. The MSP then fills the LUT with the composite distortion levels corresponding to the different memory state combinations, at a LUT filling step 132.

FIG. 5 is a flow chart that schematically illustrates yet another method for estimating the distortion in memory cell array 28, in accordance with another embodiment of the present invention. The method of FIG. 5 begins with the interfered and interfering memory cells already programmed. Neither the pre-interference values nor the memory states of the cells are known a-priori.

MSP 52 reads the memory cells, at a blind reading step 140. Since the memory states of the cells are not known in advance, the MSP estimates the memory states, at a state estimation step 144. The MSP may estimate the memory states by comparing the read values to a set of predetermined reading thresholds. In some embodiments, the MSP possesses an approximated mapping of memory state combinations to distortion levels, which may be used to improve the memory state estimation.

The MSP estimates the pre-interference values using target cells whose interfering cells are erased, at a pre-interference approximation step 148, similarly to steps 122 and 124 of the method of FIG. 4 above. Then, the MSP estimates the composite distortion for each memory state combination, at a composite distortion approximation step 152, similarly to step 128 of the method of FIG. 4 above. In the present case, however, the MSP uses the estimated memory states instead of the known memory states used in the method of FIG. 4. The MSP fills the LUT with the approximated composite distortion levels, at a table filling step 156.

In some embodiments, the method of FIG. 5 is used iteratively. In these embodiments, after the LUT is updated, the method loops back to step 144 above, and the memory states of the read cells are re-estimated using the updated LUT. The iterative process can be repeated iteratively until convergence is reached (e.g., until the variations in the LUT updates are sufficiently small).

The methods of FIGS. 3 and 4 above can also be performed sequentially, such as in order to average read noises and to track changes in the distortion mechanisms over time. For example, the LUT entries can be adapted using a Least Mean Square (LMS), sign LMS, Recursive Least Squares (RLS) or any other suitable adaptation method.

The methods of FIGS. 3-5 above are exemplary methods. Alternatively, the MSP can use any other suitable method for determining a mapping of memory state combinations of the interfering cells, and optionally the interfered cell, to the resulting composite distortion affecting the interfered cell.

Having determined the mapping, the MSP can compensate for the distortion in a number of ways. For example, when reading data from a memory cell, the MSP may read the memory states of the interfering cells, apply the mapping to the appropriate memory state combination to obtain the average distortion level, and subtract this distortion level from the value read from the memory cell.

Alternatively, the MSP may use the mapping to adjust the reading thresholds used for determining the memory states of read cells. Further alternatively, when the data stored in the memory cells is encoded using ECC, the MSP may use the mapping to compute ECC metrics that are used in the ECC decoding process. Certain aspects of ECC metric adjustment based on distortion estimation are described, for example, in PCT Patent Application PCT/IL2007/000580, entitled "Combined Distortion Estimation and Error Correction Coding for Memory Devices," filed May 10, 2007, which is assigned to the assignee of the present patent application and whose disclosure is incorporated herein by reference.

Further alternatively, the MSP can use the mapping of memory state combinations in any other distortion cancellation technique. Some exemplary techniques are described, for example, in PCT Patent Application PCT/IL2007/000576, entitled "Distortion Estimation and Cancellation in Memory Devices," filed May 10, 2007, which is assigned to the assignee of the present patent application and whose disclosure is incorporated herein by reference.

In addition to calculating the average distortion level using any of the methods described above, the MSP may calculate and store other statistical properties of the distortion, such as its variance or entire distribution function. This statistical information can be used to further improve the distortion compensation. For example, if the variance of the composite distortion for a particular memory state combination exceeds a certain level, the MSP may conclude that the distortion estimation of such a cell is unreliable.

In some embodiments, data is written to the memory cells using a Program and Verify (P&V) process, as is known in the art. The methods of FIGS. 3-5 above can be combined with the P&V process. For example, P&V processes often program the memory cells page by page in sequential order. Thus, when a certain row is written, the previous row is usually already programmed and the following row is not yet programmed. Since the values written to each row are verified in the presence of interference from the previous rows, the P&V process inherently compensates, at least partially, for interference from the previous rows. Therefore, when implementing the methods of FIGS. 3-5 in conjunction with a P&V process, it is sometimes possible to define only memory cells that were programmed later than the interfered cells as potentially-interfering cells.

The compensation of P&V processes for distortion from previously-programmed cells is usually accurate at the time the interfered cells are programmed. However, the value written into the cell tends to drift over time due to aging effects, and this drift is unaccounted for by the P&V process. In some embodiments, the estimation methods described herein can take into account and compensate for drifts in cell values that are uncorrected by the P&V process. For example, the MSP can estimate the average cell value drift, either over all memory cells or separately for each possible memory state. The distortion values stored in the LUT can be adjusted using the estimated drift. In some embodiments, the MSP can estimate and store an estimated drift value for each memory state combination, e.g., as an additional field in each row of the LUT.

In the methods described above, the LUT (or other mapping) has a resolution that is equal to the number of memory states. For example, in an SLC device and assuming N possible interferers, the LUT has $2^{N+1}$ rows. In alternative embodiments, the MSP may construct and maintain a LUT having a finer resolution. The range of analog values of the memory cells can be divided into high-resolution regions, whose number is higher than the number of memory states. Each row of the high-resolution LUT corresponds to the memory cells whose analog values fall in a particular combination of high-resolution regions.

The distortion estimation and compensation methods described herein can be carried out at any stage along the lifetime of system 20, such as during or after production, at initialization when system 20 is installed in the host system, and/or during normal operation of system 20 in the host system.

Although the embodiments described herein mainly address distortion estimation based on the combination of memory states of the interfering cells, the principles of the present invention can also be used to estimate the distortion based on the combination of the analog values stored in the interfering cells, and possibly the analog value of the interfered cells. For example, a mapping function may map each set of possible analog values to the corresponding mean distortion level or other statistical property of the distortion.

The methods and systems described herein can also be used to cancel distortion that is not necessarily actively induced in the interfered cell by the interfering cells. For example, a certain set of memory cells may have distortion components that have some statistical correlation with the distortion in the interfered cell, even though these memory cells may not be the cause of this distortion. Thus, the methods and systems described herein can be used to estimate the distortion in the interfered cell based on the combination of analog values (or memory states) of a set of memory cells, whose distortion is statistically correlated with the distortion in the interfered cell.

Although the embodiments described herein mainly address retrieving data from solid-state memory devices, the principles of the present invention can also be used for storing and retrieving data in Hard Disk Drives (HDD) and other data storage media and devices.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for operating a memory, comprising:
   storing data in analog memory cells of the memory by writing respective analog values to the analog memory cells;
   identifying a set of the analog memory cells comprising an interfered cell having a distortion that is statistically correlated with the respective analog values of the analog memory cells in the set;
   determining a mapping between combinations of possible analog values of the analog memory cells in the set and statistical characteristics of composite distortion levels present in the interfered memory cell; and
   applying the determined mapping so as to compensate for the distortion in the interfered memory cell,
   wherein determining the mapping comprises expressing the mapping by a mapping function, which produces the respective composite distortion levels responsively to the combinations of the possible analog values.

2. The method according to claim 1, wherein the combinations of the possible analog values used in determining the mapping comprise the possible analog values of the interfered memory cell.

3. The method according to claim 1, wherein the memory cells in the set have respective spatial relationships with respect to the interfered memory cell, and wherein determining the mapping comprises, for a target combination among the combinations of the possible analog values, measuring multiple values of the composite distortion levels caused in multiple other interfered memory cells by respective other sets of memory cells, which have the spatial relationship with respect to the respective other interfered memory cells and have the target combination of the analog values, and processing the multiple values of the composite distortion levels to determine a composite distortion level to which the target combination is mapped.

4. The method according to claim 3, wherein determining the mapping comprises estimating drift levels of the analog values in the interfered memory cells corresponding to the combinations of the possible analog values, and wherein applying the mapping comprises compensating for the distortion using the estimated drift levels.

5. The method according to claim 3, wherein storing the data comprises programming the analog memory cells to assume respective discrete memory states, and wherein determining the mapping comprises determining the mapping as a function of combinations of possible memory states of the memory cells in the set and the composite distortion levels present in the interfered memory cell when the memory cells in the set assume the combinations of the possible memory states.

6. The method according to claim 5, wherein measuring the multiple values of the composite distortion levels comprises:
   programming the other interfered memory cells without programming the other sets of the memory cells;
   reading the analog values from the other interfered memory cells prior to completing programming of the other sets of the memory cells;
   programming the other sets of the memory cells;
   reading the analog values from the other interfered memory cells after the other sets of the memory cells have been programmed; and
   computing the values of the composite distortion levels by comparing the analog values read when the other sets of the memory cells are not programmed to the respective analog values read after the other sets of the memory cells have been programmed.

7. The method according to claim 6, wherein reading the analog values prior to completing the programming comprises reading the analog values while the other sets of the memory cells are in an erased state.

8. The method according to claim 6, wherein reading the analog values prior to completing the programming comprises reading the analog values while the other sets of the memory cells are in a partially-programmed state.

9. The method according to claim 6, wherein reading the analog values prior to completing the programming comprises reading the analog values after some of the memory cells in the other sets of the memory cells have been programmed.

10. The method according to claim 5, wherein measuring the multiple values of the composite distortion levels comprises:
    reading the analog values from the other interfered memory cells and from the other sets of the memory cells;

identifying a subset of the other interfered memory cells whose respective sets of the memory cells are not programmed; and computing the values of the composite distortion levels by comparing the analog values read from the memory cells in the subset to the analog values read from some of the other interfered memory cells, whose respective sets of the memory cells are programmed to assume the target combination of the memory states.

11. The method according to claim 5, wherein measuring the multiple values of the composite distortion levels comprises:

reading the analog values from the other interfered memory cells and from the other sets of the memory cells;

processing the read analog values to estimate the memory states of the other interfered memory cells and of the other sets of the memory cells;

identifying a subset of the other interfered memory cells whose respective sets of the memory cells are not programmed; and computing the values of the composite distortion levels by comparing the analog values read from the memory cells in the subset to the analog values read from some of the other interfered memory cells, whose respective sets of the memory cells are estimated to have the target combination of the memory states.

12. The method according to claim 11, and comprising re-estimating the memory states of the other interfered memory cells and of the other sets of the memory cells, and updating the mapping based on the re-estimated memory states.

13. The method according to claim 5, wherein determining the mapping comprises dividing a range of the analog values into a number of regions higher than a number of the possible memory states, and determining the mapping between combinations of possible regions in which the analog values of the memory cells in the set fall and the composite distortion levels caused in the interfered memory cell by the set of the memory cells when the analog values written thereto are within the combination of the regions.

14. The method according to claim 1, wherein determining the mapping comprises storing the mapping in a Look-Up Table (LUT) that is accessed based on the combinations of the possible analog values.

15. The method according to claim 1, wherein applying the mapping comprises determining a current combination of the analog values of the memory cells in the set, applying the mapping to the current combination to produce an estimate of the distortion level in the interfered memory cell, and compensating for the distortion in the interfered memory cell based on the estimate.

16. The method according to claim 15, wherein compensating for the distortion comprises subtracting the estimate from an analog value read from the interfered memory cell.

17. The method according to claim 15, wherein compensating for the distortion comprises determining a read threshold used for reading an analog value from the interfered memory cell based on the estimate.

18. The method according to claim 15, wherein the data stored in the analog memory cells is encoded with an Error Correction Code (ECC), and wherein compensating for the distortion comprises computing a metric used for decoding the ECC based on the estimate.

19. The method according to claim 1, wherein determining the mapping comprises determining a statistical property of the composite distortion levels, and wherein applying the mapping comprises compensating for the distortion in the interfered memory cell responsively to the statistical property.

20. The method according to claim 1, wherein determining the mapping comprises determining a first mapping that applies to the memory cells located in a first area of the memory, and a second mapping that applies to the memory cells located in a second area of the memory different from the first area.

21. The method according to claim 1, wherein the distortion in the interfered memory cell is caused by first and second different distortion mechanisms, and wherein determining the mapping comprises determining first and second mappings that respectively correspond to the first and second distortion mechanisms.

22. The method according to claim 1, wherein determining the mapping comprises determining a first mapping that applies to a first order of programming the interfered memory cell with respect to programming the memory cells in the set, and a second mapping that applies to a second order of programming the interfered memory cell with respect to programming the memory cells in the set, different from the first order.

23. The method according to claim 1, wherein the statistical characteristics comprise a mean distortion level.

24. The method according to claim 1, wherein determining the mapping comprises measuring the statistical characteristics of the composite distortion levels after installation of the memory in a host system, responsively to operation of the memory in the host system.

25. A method for operating a memory, comprising:

storing data in analog memory cells of the memory by writing respective analog values to the analog memory cells;

identifying a set of the analog memory cells comprising an interfered cell having a distortion that is statistically correlated with the respective analog values of the analog memory cells in the set;

determining a mapping between combinations of possible analog values of the analog memory cells in the set and statistical characteristics of composite distortion levels present in the interfered memory cell; and applying the determined mapping so as to compensate for the distortion in the interfered memory cell, wherein determining the mapping comprises adaptively updating the mapping over time.

26. A data storage apparatus, comprising:

an interface, which is operative to communicate with a memory that includes a plurality of analog memory cells; and a memory signal processor (MSP), which is connected to the interface and is coupled to store data in the analog memory cells of the memory by writing respective analog values to the analog memory cells, to determine, for a set of the analog memory cells comprising an interfered cell having a distortion that is statistically correlated with the respective analog values of the analog memory cells in the set, a mapping between combinations of possible analog values of the analog memory cells in the set and statistical characteristics of composite distortion levels present in the interfered memory cell, and to apply the determined mapping so as to compensate for the distortion in the interfered memory cell, wherein the MSP is coupled to express the mapping by a mapping function, which produces the respective composite distortion levels responsively to the combinations of the possible analog values.

27. The apparatus according to claim 26, wherein the combinations of the possible analog values used in determining the mapping comprise the possible analog values of the interfered memory cell.

28. The apparatus according to claim 26, wherein the memory cells in the set have respective spatial relationships with respect to the interfered memory cell, and wherein the MSP is coupled to determine the mapping for a target combination among the combinations of the possible analog values by measuring multiple values of the composite distortion levels present in multiple other interfered memory cells by respective other sets of the memory cells, which have the spatial relationship with respect to the respective other interfered memory cells and have the target combination of the analog values, and processing the multiple values of the composite distortion levels to determine a composite distortion level to which the target combination is mapped.

29. The apparatus according to claim 28, wherein the MSP is coupled to estimate drift levels of the analog values in the interfered memory cells corresponding to the combinations of the possible analog values, and to compensate for the distortion using the estimated drift levels.

30. The apparatus according to claim 26, wherein the MSP is coupled to program the analog memory cells to assume respective discrete memory states, and to determine the mapping as a function of combinations of possible memory states of the memory cells in the set and the composite distortion levels present in the interfered memory cell when the memory cells in the set assume the combinations of the possible memory states.

31. The apparatus according to claim 30, wherein the MSP is coupled to measure the multiple values of the composite distortion levels by:
programming the other interfered memory cells without programming the other sets of the memory cells;
reading the analog values from the other interfered memory cells prior to completing programming of the other sets of the memory cells;
programming the other sets of the memory cells;
reading the analog values from the other interfered memory cells after the other sets of the memory cells have been programmed; and
computing the values of the composite distortion levels by comparing the analog values read when the other sets of the memory cells are not programmed to the respective analog values read after the other sets of the memory cells have been programmed.

32. The apparatus according to claim 31, wherein the MSP is configured to read the analog values prior to completing the programming by reading the analog values while the other sets of the memory cells are in an erased state.

33. The apparatus according to claim 31, wherein the MSP is configured to read the analog values prior to completing the programming by reading the analog values while the other sets of the memory cells are in a partially-programmed state.

34. The apparatus according to claim 31, wherein the MSP is configured to read the analog values prior to completing the programming by reading the analog values after some of the memory cells in the other sets of the memory cells have been programmed.

35. The apparatus according to claim 30, wherein the MSP is coupled to measure the multiple values of the composite distortion levels by:
reading the analog values from the other interfered memory cells and from the other sets of the memory cells;
identifying a subset of the other interfered memory cells whose respective sets of the memory cells are not programmed; and
computing the values of the composite distortion levels by comparing the analog values read from the memory cells in the subset to the analog values read from some of the other interfered memory cells, whose respective sets of the memory cells are programmed to assume the target combination of the memory states.

36. The apparatus according to claim 30, wherein the MSP is coupled to measure the multiple values of the composite distortion levels by:
reading the analog values from the other interfered memory cells and from the other sets of the memory cells;
processing the read analog values to estimate the memory states of the other interfered memory cells and of the other sets of the memory cells;
identifying a subset of the other interfered memory cells whose respective sets of the memory cells are not programmed; and
computing the values of the composite distortion levels by comparing the analog values read from the memory cells in the subset to the analog values read from some of the other interfered memory cells, whose respective sets of the memory cells are estimated to have the target combination of the memory states.

37. The apparatus according to claim 36, wherein the MSP is coupled to re-estimate the memory states of the other interfered memory cells and of the other sets of the memory cells, and to update the mapping based on the re-estimated memory states.

38. The apparatus according to claim 30, wherein the MSP is coupled to divide a range of the analog values into a number of regions higher than a number of the possible memory states, and to determine the mapping between combinations of possible regions in which the analog values of the memory cells in the set fall and the composite distortion levels caused in the interfered memory cell by the set of the memory cells when the analog values written thereto are within the combination of the regions.

39. The apparatus according to claim 26, wherein the MSP is coupled to store the mapping in a Look-Up Table (LUT) that is accessed based on the combinations of the possible analog values.

40. The apparatus according to claim 26, wherein the MSP is coupled to determine a current combination of the analog values of the memory cells in the set, to apply the mapping to the current combination to produce an estimate of the distortion level in the interfered memory cell, and to compensate for the distortion in the interfered memory cell based on the estimate.

41. The apparatus according to claim 40, wherein the MSP is coupled to subtract the estimate from an analog value read from the interfered memory cell.

42. The apparatus according to claim 40, wherein the MSP is coupled to determine a read threshold used for reading an analog value from the interfered memory cell based on the estimate.

43. The apparatus according to claim 40, wherein the data stored in the analog memory cells is encoded with an Error Correction Code (ECC), and wherein the MSP is coupled to compute a metric used for decoding the ECC based on the estimate.

44. The apparatus according to claim 26, wherein the MSP is coupled to determine a statistical property of the composite distortion levels, and to compensate for the distortion in the interfered memory cell responsively to the statistical property.

45. The apparatus according to claim 26, wherein the MSP is coupled to determine a first mapping that applies to the memory cells located in a first area of the memory, and a second mapping that applies to the memory cells located in a second area of the memory different from the first area.

46. The apparatus according to claim 26, wherein the distortion in the interfered memory cell is caused by first and second different distortion mechanisms, and wherein the MSP is coupled to determine first and second mappings that respectively correspond to the first and second distortion mechanisms.

47. The apparatus according to claim 26, wherein the MSP is coupled to determine a first mapping that applies to a first order of programming the interfered memory cell with respect to programming the memory cells in the set, and a second mapping that applies to a second order of programming the interfered memory cell with respect to programming the memory cells in the set, different from the first order.

48. The apparatus according to claim 26, wherein the statistical characteristics comprise a mean distortion level.

49. The apparatus according to claim 26, wherein the MSP is configured to determine the mapping by measuring the statistical characteristics of the composite distortion levels after installation of the memory in a host system, responsively to operation of the memory in the host system.

50. A data storage apparatus, comprising:
an interface, which is operative to communicate with a memory that includes a plurality of analog memory cells; and
a memory signal processor (MSP), which is connected to the interface and is coupled to store data in the analog memory cells of the memory by writing respective analog values to the analog memory cells, to determine, for a set of the analog memory cells comprising an interfered cell having a distortion that is statistically correlated with the respective analog values of the analog memory cells in the set, a mapping between combinations of possible analog values of the analog memory cells in the set and statistical characteristics of composite distortion levels present in the interfered memory cell, and to apply the determined mapping so as to compensate for the distortion in the interfered memory cell,
wherein the MSP is coupled to adaptively update the mapping over time.

51. A data storage apparatus, comprising:
a memory, which comprises a plurality of analog memory cells; and
a memory signal processor (MSP), which is connected to the memory and is coupled to store data in the analog memory cells of the memory by writing respective analog values to the analog memory cells, to determine, for a set of the analog memory cells comprising an interfered cell having a distortion that is statistically correlated with the respective analog values of the analog memory cells in the set, a mapping between combinations of possible analog values of the analog memory cells in the set and statistical characteristics of composite distortion levels present in the interfered memory cell, and to apply the determined mapping so as to compensate for the distortion in the interfered memory cell,
wherein the MSP is coupled to express the mapping by a mapping function, which produces the respective composite distortion levels responsively to the combinations of the possible analog values.

* * * * *